(12) United States Patent
Yang et al.

(10) Patent No.: US 6,771,720 B1
(45) Date of Patent: Aug. 3, 2004

(54) AMPLIFICATION CONTROL SCHEME FOR A RECEIVER

(75) Inventors: Ganning Yang, Irvine, CA (US); John S. Walley, Portola Hills, CA (US); Yi Weng, Mission Viejo, CA (US)

(73) Assignee: Skyworks Solution, Inc., Irvine, CA (US)

( * ) Notice: Subject to any disclaimer, the term of this patent is extended or adjusted under 35 U.S.C. 154(b) by 13 days.

(21) Appl. No.: 09/823,488

(22) Filed: Mar. 30, 2001

(51) Int. Cl.$^7$ .............................................. H04L 27/08
(52) U.S. Cl. ...................................................... 375/345
(58) Field of Search ................................ 375/345, 340, 375/324, 316

(56) References Cited

U.S. PATENT DOCUMENTS

| | | | | |
|---|---|---|---|---|
| 5,276,706 A | * | 1/1994 | Critchlow | 375/343 |
| 5,617,060 A | * | 4/1997 | Wilson et al. | 330/129 |
| 5,764,706 A | * | 6/1998 | Carlin et al. | 375/326 |
| 6,104,238 A | * | 8/2000 | Mattisson et al. | 329/319 |
| 6,370,133 B1 | * | 4/2002 | Kang et al. | 370/342 |
| 6,516,185 B1 | * | 2/2003 | MacNally | 455/234.1 |
| 6,638,170 B1 | * | 10/2003 | Crumby | 463/42 |
| 6,643,336 B1 | * | 11/2003 | Hsieh et al. | 375/343 |
| 2002/0071477 A1 | * | 6/2002 | Orava | 375/132 |

OTHER PUBLICATIONS

"Specification of the Bluetooth System", [online] Specification vol. 1, Version 1.0B, dated Dec. 1, 1999, Core pp. 3–13 and Part B pp. 34–35; 47–50; and 143–146, retrieved from the Internet: <URL: http://www.bluetooth.com/developer/specification/specification.asp>.

"Specification of the Bluetooth System", [online] Specification, vol. 1, Version 1.1, Feb. 22, 2001, Core pp. 2–3 and Part B pp. 34–97; 47–52; and 142–147, retrieved from the Internet: <URL http://www.bluetooth.com/developer/specification/specification.asp>.

* cited by examiner

Primary Examiner—Khai Tran
Assistant Examiner—Kevin M Burd
(74) Attorney, Agent, or Firm—Thomas, Kayden, Horstemeyer & Risley, LLP

(57) ABSTRACT

A system is provided for controlling amplification in a receiver. The receiver amplifies a signal in accordance with a controlled gain to enhance the reliability of demodulating the received signal. A lower frequency signal is derived by down-converting the received signal. The derived lower frequency signal is converted into a digital baseband signal. A compensatory direct current offset is determined by evaluation of one of trailing symbols and a defined sequence of a data packet of the received signal. A compensatory direct current offset is manipulated with respect to a digital baseband signal to compensate for an unwanted direct current offset of the digital baseband signal, indicative of a frequency difference between the received signal and the transmitted signal.

43 Claims, 12 Drawing Sheets

AMPLIFICATION CONTROL SCHEME FOR A RECEIVER

BACKGROUND OF THE INVENTION

1. Technical Field

This invention relates to an amplification control scheme for a receiver used in wireless communications.

2. Related Art

A wireless communication system uses transmitters, receivers or transceivers to facilitate the exchange of data between electronic devices. In an open specification environment, the data structure of data packets is often described in technical specifications related to the open standard to promote the wireless operability between different electronic devices. For example, the Bluetooth standard may allow products from different manufacturers to communicate and understand each other over a short distance.

A wireless communications protocol, such as that defined by the Bluetooth standard, may include a data structure of a data packet. For example, a data packet may comprise a preamble (e.g., an access code preamble) at or near a beginning of a data packet. The data of a preamble may be subject to corruption where a low-noise amplifier is switched into and out of the received signal path to adjust the amplification of the received signal. The low-noise amplifier may be switched into and out of the received signal path to maintain an appropriate signal strength range above the noise floor. If the data of the preamble is corrupted, the function or data processing supported by the data of the preamble may be lost or degraded. In one example, a preamble of the data packet may contain data that facilitates reduction of a direct current component introduced by any frequency offset of the receiver with respect to the transmitted signal. In another example, a preamble of a data packet may contain synchronization data to synchronize the modulator of a transmitter and the demodulator of a receiver. Accordingly, corruption of the preamble may degrade the modulation performance because of the presence of an increased, direct current component in the received signal, deficient or inaccurate synchronization information, or both. Thus, a need exists for an amplification control scheme for a receiver to support reliable operation of the demodulator of the receiver, while maintaining an appropriate signal strength range.

SUMMARY

An amplification control scheme of a receiver is provided and may be performed in the digital domain to support the switching of an amplifier or the adjustment of gain of the amplifier with respect to a received signal path in a manner that preserves the integrity of data or a payload within at least one data packet. The amplification control scheme may be well suited for enhancing the demodulation performance of the receiver over a broad dynamic range of received signal strengths.

A frequency offset estimator reads a group of bits or symbols at or near the end of an access code of a data packet to enhance demodulation performance. For example, the group of bits may be trailing bits extracted from a trailer of an access code of the data packet or, in the absence of a trailer, data bits extracted from a group of bits in a Baker sequence. An unwanted direct current component may be attributable to a possible difference between the local oscillator frequency of the receiver and the oscillator frequency of the transmitter or any propagational anomalies introduced in the propagation path between the transmitter and receiver. The frequency offset estimator may determine a compensatory frequency offset in the digital domain to compensate for drift or any other difference in the frequency of oscillation of the transmitter and receiver communicating therewith. The reduction or elimination of frequency offset in the digital domain may be achieved by manipulating (e.g., adding) a compensatory direct current component with respect to the digital baseband signal to compensate for the unwanted direct current component. The compensatory direct current component may have a magnitude opposite to that of the unwanted direct current component, where the compensatory direct current component is added to the digital baseband signal to reduce or eliminate the unwanted direct current component.

A matched filter or a timing estimator may perform correlation between a received signal and a reference signal to detect a burst of a data packet of the received signal and to determine the timing parameters associated with the burst. In one embodiment, the timing estimator may include a correlator for determining the correlation between a receive set of bits in a receive data packet and a reference set of bits in a reference data packet (e.g., synchronization word). The received set of bits and the reference set of bits generally coincide in logic value (or are at least highly correlated) when synchronization or temporal alignment is achieved between the received signal and locally generated signals. The modulator of the receiver is synchronized with the modulator of the transmitter by delaying or otherwise filtering the received signal consistent with the detection of the general peak of the correlation.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

DETAILED DESCRIPTION OF PREFERRED EMBODIMENTS

Figure 1:
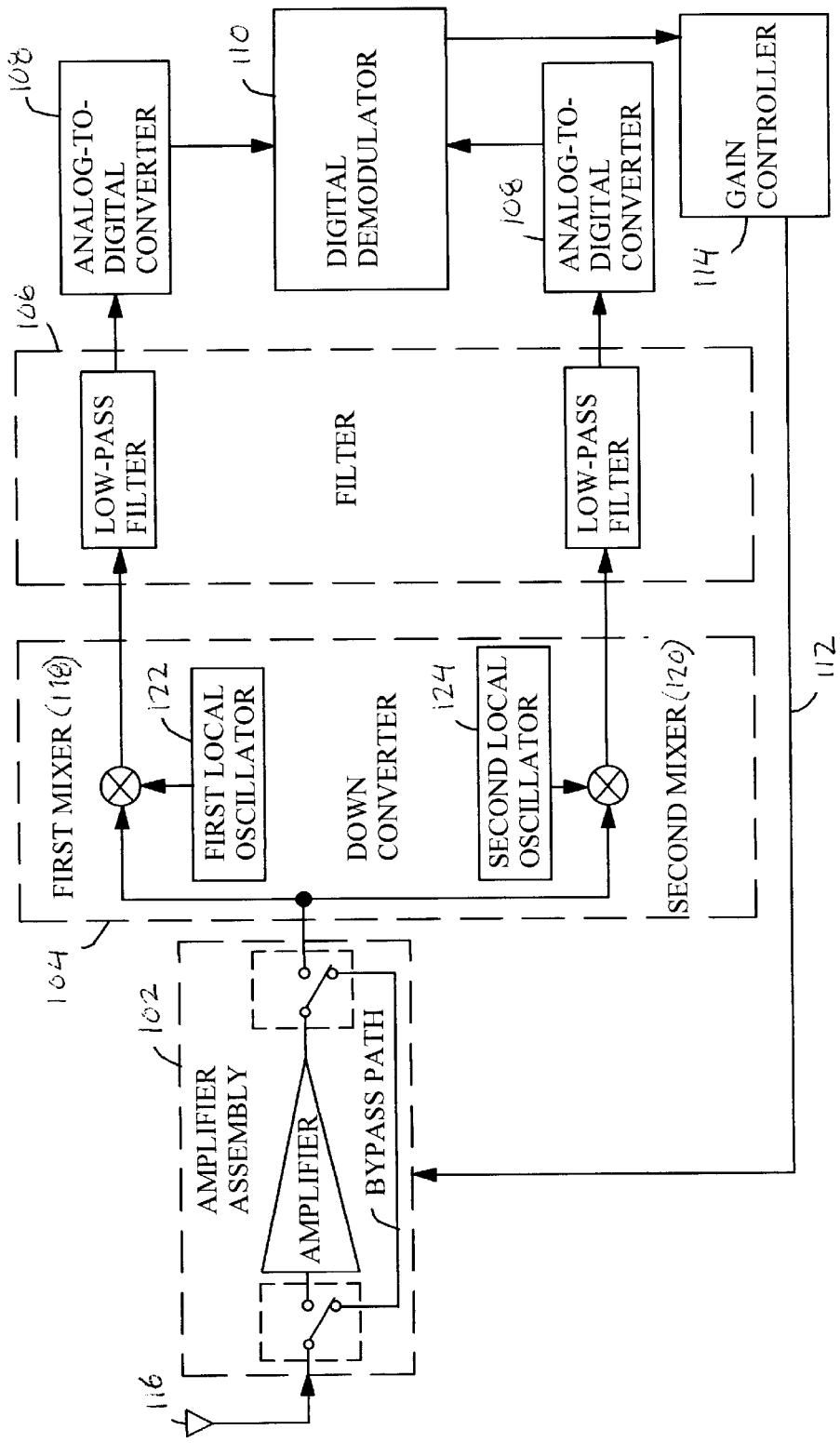
FIG. 1 is a block diagram of a receiver.

FIG. 1 is a block diagram of a receiver 100. The receiver 100 includes an amplifier 102 for electromagnetic radiation (e.g., radio frequency signals). The receiver 100 controls an amplifier 102 for amplifying a received signal in accordance with a controlled gain to enhance the reliability of demodulating the receive signal. The amplifier 102 is coupled to a downconverter 104. In turn, the downconverter 104 is coupled to a low-pass filter 106 or another filter. The low-pass filter 106 or other filter feeds one or more analog-to-digital converters 108. The analog-to-digital converters 108 provide a digital signal to a digital demodulator 110. In turn, the digital demodulator 110 provides a gain control signal 112 as feedback to the amplifier 102 to control or adjust the gain of the amplifier 102. For example, the gain controller 114 may control the gain of the amplifier 102 so as to increase the dynamic range of received signals that the receiver 100 can reliably receive and demodulate.

The amplifier 102 may represent a low-noise amplifier that receives a received signal from an antenna 116 or a transmission line. The downconverter 104 derives a lower frequency signal from down-converting the received signal. At least one analog-to-digital converter 108 converts the derived lower frequency signal into a digital baseband signal.

The downconverter 104 may include a first mixer 118, a second mixer 120, and at least one local oscillator (e.g., 122 or 124). The amplifier 102 has an amplified output that is coupled to a first mixer 118 and a second mixer 120. Further, the amplifier 102 has a control input for receiving a control signal or control data from the gain controller 114. The first mixer 118 and the second mixer 120 take the amplified received signal and multiply it by local oscillator signals to down-convert the received signal. The first local oscillator signal of a first local oscillator 122 is preferably offset by a predetermined phase difference with respect to a second local oscillator signal of a second local oscillator 124. For example, the phase of the first local oscillator signal may be offset 90 degrees from the phase of the second local oscillator signal, where the first local oscillator signal and the second oscillator signal are substantially identical in frequency. The local oscillator frequencies are selected to be commensurate with or equal to a frequency of a carrier of the received signal at the antenna 116 in a direct conversion scheme as shown in FIG. 1. However, in an alternate embodiment the local oscillator frequencies may be arranged to support an intermediate frequency conversion scheme. The first mixer 118 and the second mixer 120 output lower frequency signals (e.g., baseband signals) that may be optionally amplified prior to application to a low-pass filter 106 and an analog-to-digital converter 108. The signal from the first mixer 118 is referred to as an I baseband analog signal (i.e., in-phase baseband signal), whereas the signal from the second mixer 120 is referred to as a Q baseband analog signal (i.e., offset phase baseband signal).

One or more analog-to-digital converters 108 may be used to convert the I baseband signal into an I digital signal and to convert the Q baseband signal into a Q digital signal, respectively. The digital demodulator 110 receives the I digital signal and the Q digital signal and converts the signals from a rectangular domain to a polar domain to extract phase information (θ) and a phase difference in a time interval (e.g., a symbol duration). The demodulated signal may be in the form of a digital pulse train (e.g., a pulse code modulation signal) or the like. The digital demodulator 110 also provides data to the gain controller 114.

The gain controller 114 adjusts at least the gain of the amplifier 102 or the application of the amplifier 102 to the received signal path. For example, the gain controller 114 may switch the amplifier 102 into a receive signal path between the antenna 116 and the downconverter 104. Likewise, the gain controller 114 may switch the amplifier 102 out of the receive signal path between an antenna 116 and the downconverter 104.

In an alternative embodiment, the amplifier 102 may be embodied as a series of cascaded stages that are selectively switched in and switched out the receive path to incrementally adjust the gain of the receive signal. In another alternate embodiment, the amplifier 102 may be associated with a direct current biasing network that the gain controller 114 adjusts to, in turn, adjust the gain of the amplifier 102.

Although the gain controller 114 may adjust as few components as an amplifier that is a first stage (e.g., amplifier 102), in yet another alternate embodiment, the gain controller 114 may also be used to adjust one or more optional amplifiers (e.g., a first amplification stage of FIG. 13 or a second amplification stage 1302 of FIG. 13) placed in the signal path between the downconverter 104 and the analog-to-digital converter 108.

Figure 2:
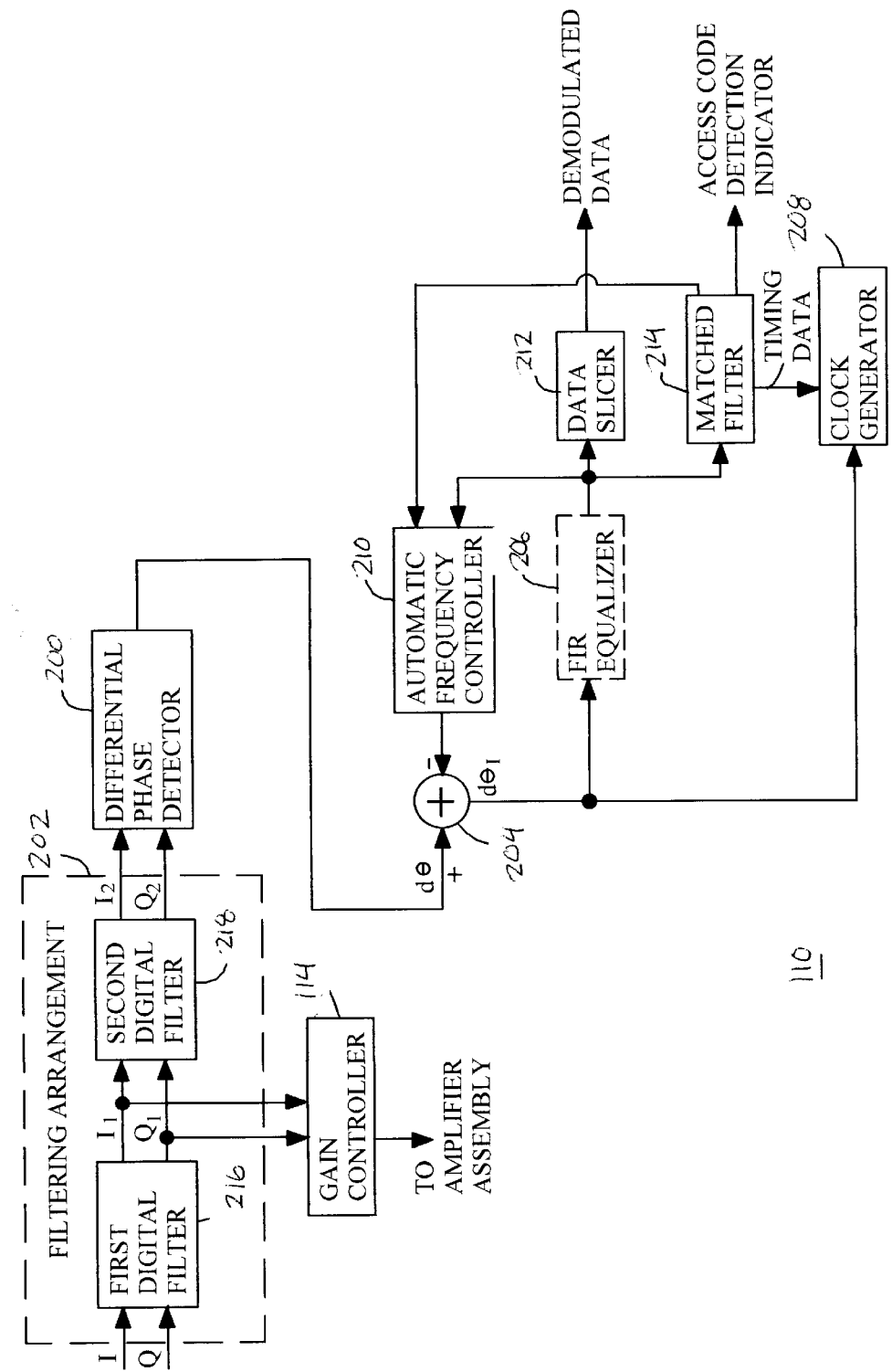
FIG. 2 is a block diagram illustrating a demodulator of the receiver shown in FIG. 1.

A transmitter (not shown) transmits an electromagnetic signal that may be received or intercepted by the antenna 116 of the receiver 100. For various reasons, the frequency or phase of the transmission may differ from the frequency of the local oscillator in a manner that introduces an unwanted direct current component into the baseband signal (e.g., digital baseband signal) at the output of the differential phase detector 200. Although FIG. 2 shows a differential phase detector 200, similar concerns of the unwanted direct current component would apply to a frequency detector (e.g., for a frequency shift keying demodulator). The introduction of the unwanted DC offset may hinder optimal performance of the digital demodulator 110 in demodulating the baseband signals (e.g., I baseband digital signals and Q baseband digital signals). Accordingly, in the digital domain the receiver 100 (e.g., the digital demodulator 110) may introduce a compensatory direct current offset to compensate for the unwanted direct current offset in the baseband signal. The unwanted direct current offset of the baseband signal may result from an offset frequency between the transmitter and the receiver 100. Thus, the receiver 100 of FIG. 1 is well-suited for producing a stable signal that is reliably demodulated in a manner that compensates and mitigates for the effect of possible frequency offset between the received signal and the transmitted signal.

FIG. 2 shows the demodulator 110 of FIG. 1 in greater detail. The digital demodulator 110 includes a filtering arrangement 202 that is coupled to a differential phase detector 200. In turn, the differential phase detector 200 is coupled to a summer 204. The summer 204 has one negative input signal (i.e., a compensatory direct current offset of negative magnitude) and one positive input signal. Therefore, the summer 204 may be replaced by a subtracter having two positive input signals to achieve the same output result as the summer 204.

Throughout this document, a summer (e.g., summer 204) may be associated with a compensatory direct current offset that is opposite in magnitude with respect to an unwanted direct current offset by definition. That is, if the unwanted direct current offset is positive, the compensatory direct current offset is negative, and vice versa.

Instead, if the compensatory direct current offset were defined as having the same magnitude as the unwanted direct current offset (e.g., both have positive values or negative values), the summer would be replaced by a subtracter to achieve the desired cancellation of the unwanted direct current offset. For example, if the unwanted frequency direct current offset is estimated as a positive value, the unwanted direct current offset may be canceled by subtracting a positive value of the compensatory direct current component from the digital signal.

The summer 204 is associated with a finite impulse response (FIR) equalizer 206, a clock generator 208, and an automatic frequency controller 210. The output of the FIR equalizer 206 is coupled to a data slicer 212 and a matched filter 214. The data slicer 212 outputs the demodulated data. The matched filter 214 performs timing and frequency estimation. The matched filter 214 is coupled to the clock generator 208. The matched filter 214 outputs access code detection indicator.

The filtering arrangement 202 for filtering the digital baseband signal comprises a first digital filter 216 cascaded with a second digital filter 218 to realize, in effect, a low-pass response of magnitude versus frequency in the frequency domain. A gain controller 114 receives an intermediately filtered result from the first digital filter 216 to generate a control signal for controlling the controlled gain during a preamble duration (e.g., an access code preamble duration) of the data packet (e.g., a Bluetooth compliant data packet 300 in FIG. 3). A preamble duration refers to a time span of a data packet preamble of a data packet, a time span of an access code preamble, or both. The differential phase detector 200 may detect a differential phase of the filtered signal.

The filtering arrangement 202 may include a first digital filter 216 in cascade with a second digital filter 218. The first digital filter 216 may have a first filter response (e.g., a low pas response) in which the magnitude passed by the filter is highest for a lower frequency and lower for a higher frequency. For example, a frequency versus magnitude response of the first filter response may be modeled as a Sinc function (e.g., $Sinc^5$ function). A $Sinc^5$ function means that five sinc functions are cascaded together. The second filter response of the second digital filter 218 may represent a droop correction response such that the aggregate filter response produced by the combination of the first filter response and the second filter response produces more of a selective frequency response (e.g., a response resembling a step-function in magnitude versus frequency) than would otherwise be possible. Thus, the combination of the first digital filter 216 and the second digital filter 218 makes the aggregate filter response more frequency selective and more flat in the passband in the digital domain.

The gain controller 114 may tap into the filtering arrangement 202 between the first digital filter 216 and the second digital filter 218. The gain controller 114 accepts the output of the first digital filter 216 to maximize the responsiveness of the electromagnetic radiation (e.g., radio frequency) gain control of the amplifier 102 by minimizing the delay through which the baseband signal, derived from the received signal, travels. Accordingly, the first digital filter 216, the second digital filter 218 and the gain controller 114 cooperate to form a time-responsive system for rapidly and accurately adjusting the radio frequency gain control of the amplifier 102.

The filter response of the first filter may be defined in accordance with the following equation in the Z domain.

$$H(Z) = \left( \frac{(1-Z^{-4})^5}{(1-Z^{-1})^5} \right)$$

The first digital filter 216 may represent a sinc function to the fifth power type of filter. The second digital filter 218 may down sample the first digital filter output by two. Secondly, the second digital filter 218 may include an eleven-tap FIR filter with certain predetermined coefficients. For example, the predetermined coefficients may be the following: {⅛, −1, 18/8, 30/8, 43/8, 5, 43/8, −30/8, 18/8, −1, and ⅛.}.

The differential phase detector 200 is coupled to the output of the filtering arrangement 202. The differential phase detector 200 provides a differential phase output signal (dθ). The differential phase output represents a phase difference in a time interval, for instance, an interval of one symbol duration. In one embodiment, the differential phase detector 200 comprises a rectangular-domain-to-polar-domain converter that converts the I baseband signal and the Q baseband signals into a polar domain signal with respect to a certain time interval. A polar domain signal may be expressed mathematically as a function of (R, θ), where R is the magnitude of a phasor and θ is the angle of the phasor. After converting the baseband signals to the polar domain signal, a delayed version of the polar domain signal is subtracted from a non-delayed version of the polar domain signal to obtain the differential phase output signal (dθ) with respect to a certain time interval. In one example, the time interval corresponds to the duration of one symbol or one bit.

In an alternate embodiment, the FIR equalizer 206 is included to improve the performance of the demodulator 110 and to reduce the incidence of misread symbols in the received signal. The FIR equalizer 206 is delineated by dashed lines to indicate the FIR equalizer 206 is optional. The differential phase output signal from the differential phase detector 200 may be filtered by the FIR equalizer 206. The FIR equalizer 206 may emphasize the amplitude excursions of the input to the FIR equalizer 206 to produce an output of the FIR equalizer 206 with uniform amplitude excursions. For example, the amplitude excursions of the receive signal may be normalized or limited within a certain fixed range.

The data slicer 212 makes a final decision on the true value of the equalized or unequalized differential phase output signal of the phase detector output 200. The summer or the FIR equalizer 206 provides an input to the matched filter 214 with a timing and a frequency estimator.

The matched filter 214 provides an estimated frequency to the automatic frequency control. Further, the matched filter 214 provides a timing signal to a clock generator 208 and may introduce a phase correction or a time shift or phase shift associated with the clock generator 208 such that the transmitted signal and a received signal are synchronized to promote reliable demodulation of the data by the demodulator 110.

A matched filter 214 receives the detected phase signal from the differential phase detector 200 via one or more intermediate components, such as a summer 204 and an FIR equalizer 206. The matched filter 214 includes a timing estimator that estimates the timing of a received signal with respect to a reference signal to determine a phase adjustment of a clock associated with the detection of the received signal. The timing estimator includes a correlator for determining a correlation between a received synchronization word (e.g., received synchronization word 404) of the received signal and a reference synchronization word of a reference signal to find a clock phase adjustment necessary to attain a peak correlation, where the defined sequence represents at least a portion of the received synchronization word.

In an alternate embodiment, the matched filter 214 may provide a gain control signal from the matched filter 214 to the gain controller 114.

The automatic frequency controller 210 may compensate for the undesired DC offset in accordance with at least two alternative techniques. In accordance with a first technique, the compensatory DC offset is arranged to have an opposite magnitude with respect to the unwanted DC offset such that the summer 204 adds a compensatory DC offset to the undesired DC offset. The compensatory DC bias or offset is related to the frequency in the received signal or in the baseband signal with respect to the transmitted signal. The automatic frequency controller 210 may add a compensatory DC offset value via the summer 204 to compensate for any undesired DC offset in the differential phase signal outputted by the differential phase detector 200. In accordance with a second technique, the compensatory DC offset has the same magnitudal sign (e.g., positive) as the unwanted DC offset such that a subtracter replaces the summer 204 to subtract alternate compensatory DC offset from the desired DC offset. Accordingly, a summer 204 or a subtracter may be used to reduce or eliminate undesired DC offset by canceling out the undesired DC offset.

In the matched filter 214, a frequency estimator determines a compensatory direct current offset to the digital baseband signal to compensate for an unwanted direct current offset of the digital baseband signal, indicative of a frequency difference between the received signal and a transmitted signal. The frequency estimator determines the compensatory direct current offset by evaluation of a group of trailing symbols, a defined sequence of a data packet (e.g., a Bluetooth compliant data packet 300 in FIG. 3), or both of the received signal. In one example, the trailing symbols include four trailing bits within a trailer 406 (FIG. 4) of an access code 302 (FIG. 3 and FIG. 4) of the data packet (e.g., a Bluetooth compliant data packet 300). In another example, the defined sequence refers to the last symbols or group of most significant bits of the received synchronization codeword. Further, the defined sequence may refer to the last three symbols or bits or a sixty-four symbol received synchronization word in the context of the Bluetooth standard. In another example, the defined sequence includes at least part of a Baker sequence of bits in the data packet (e.g., a Bluetooth compliant data packet 300), where the Baker series has alternating data values in succession.

Figure 3:
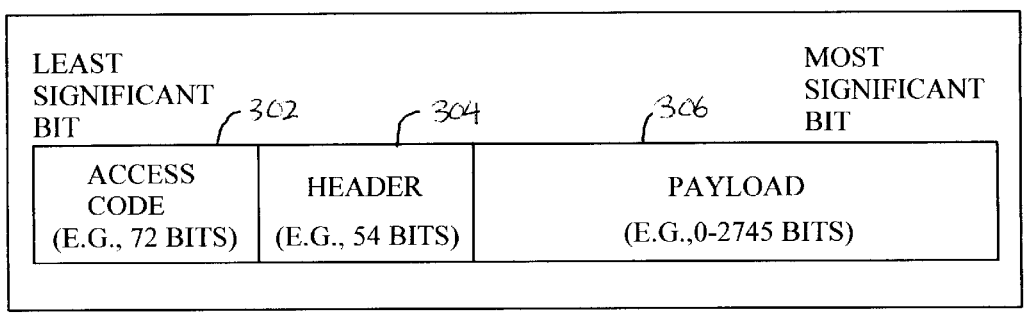
FIG. 3 is a data packet of a received signal that may be received by the receiver of FIG. 1.

FIG. 3 shows a Bluetooth-compliant data packet 300. In accordance with the Bluetooth standard, a Bluetooth-compliant data packet 300 includes the following components: an access code 302, a header 304, and a payload 306. The access code 302 preferably precedes the header 304. The payload 306 preferably follows both the access code 302 and the header 304. The access code 302 may be represented by the least significant bits of a codeword, while the payload 306 may be represented by the most significant bits of the codeword. Although the access code 302, the header 304 and the payload 306 may contain virtually any number of symbols (e.g., bits), as shown in FIG. 3, the access code 302 has a fixed size of approximately 902 bits, the header 304 has a fixed size of approximately 54 bits, and the payload 306 has a variable size within the range of 0 bits to approximately 2,745 bits.

Figure 4:
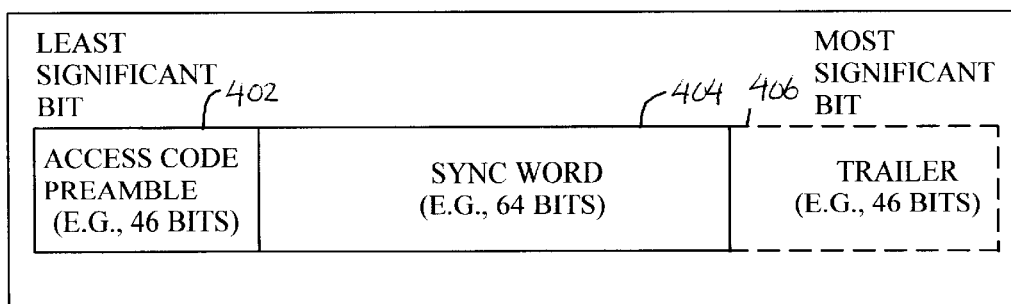
FIG. 4 is an access code portion of the data packet of FIG. 3.

FIG. 4 shows a diagram of a constituent component 400 of a Bluetooth-compliant data packet 300 of FIG. 3. The constituent component 400 refers to a data packet preamble, which may in the form of an access code 302. In turn, the access code 302 includes an access code preamble 402. As used throughout this document, a preamble may refer to a data packet preamble, an access code preamble 402, or both. A data packet preamble generally refers to a beginning portion of any data packet, whereas an access code preamble 402 refers to a group of beginning symbols of the access code 302.

The access code 302 includes the access code preamble 402, a received synchronization word 404, and a trailer 406. The access code preamble 402 precedes the received the synchronization word 404. In turn, the received synchronization word 404 potentially precedes a trailer 406, which may or may not be present. Under a Bluetooth standard, the access code preamble 402 is a fixed length pattern of alternating symbol values. For example, the access code preamble 402 may be expressed as 1010 or 0101 depending upon the values of the least significant bit of the received synchronization word. The trailer 406 contains trailing bits.

Under one version of the Bluetooth standard, a received synchronization word 404 may be a 64-bit long codeword derived from a 24 bit address that distinguishes electronic devices from one another. An end portion of the received synchronization word 404 may contain a Baker sequence of bits if the trailer 406 is not present. Here, a Baker sequence generally refers to a group of latter symbols or most significant bits of the received synchronization word (e.g., the last seven bits of the received synchronization word). The Baker sequence generally has alternating symbol values (i.e., a high logic level, followed by a low logic level, or vice versa) for at least the last three bits of the Baker sequence.

The least significant bits represent the access code preamble 402, whereas the most significant bits represent the trailer 406 or the end of the received synchronization word 404. Although virtually any number of bits may be allocated to the constituents of the access code 302, in the Bluetooth standard as shown in FIG. 4 the access code preamble 402 may occupy four bits, the received synchronization word 404 may occupy 64 bits, and the trailer 406 may occupy 4 bits.

The receiver 100 may independently adjust a new gain of the amplifier upon the receipt of each data packet, regardless of a prior gain of a prior data packet. Further, the gain of the amplifier may be adjusted during the duration of a preamble (e.g., access code preamble or a data packet preamble) so as not to disrupt the reception of the synchronization word or trailer, if any.

Figure 5:
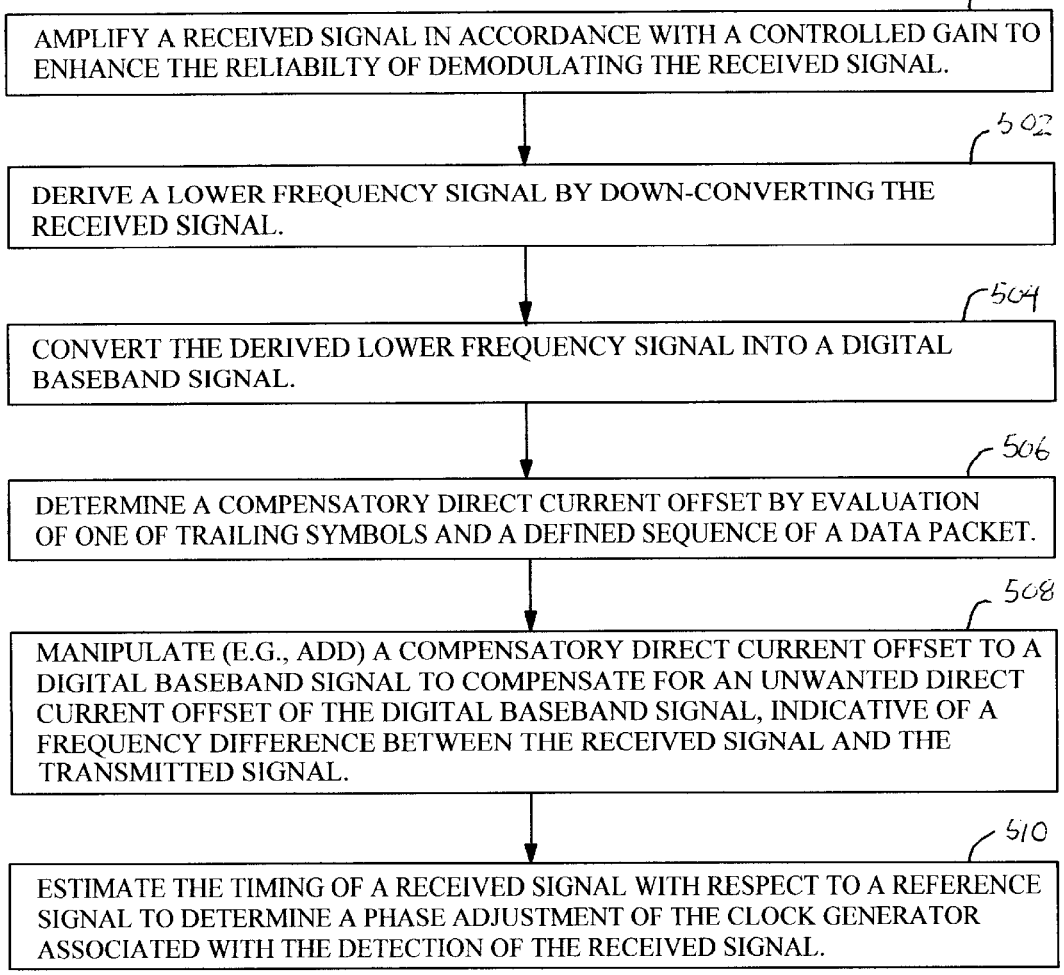
FIG. 5 is a flowchart of a method for controlling amplification of a receiver for a wireless communication.

FIG. 5 is a flow chart of a method for controlling amplification of a receiver 100. The method of FIG. 5 starts in step 500. In step 500, at least the amplifier 102 amplifies a received signal in accordance with a controlled gain to enhance the reliability of demodulating the received signal. The controlled amplification may be used to increase the dynamic range of the receiver 100. That is, the controlled amplification may increase the range of signal strengths that the receiver 100 can receive.

In one embodiment, any change to the gain of the amplifier 102 is completed during a preamble duration (e.g., a duration of an access code preamble 402 or a data packet preamble) of a data packet (e.g., a Bluetooth compliant data packet 300) of the receive signal. In another embodiment, any change to the gain of the amplifier 102 is completed during a preamble duration (e.g., a duration of an access code 302 or a data packet preamble) of the data packet (e.g., a Bluetooth compliant data packet 300) during the reception of four symbols. During a remainder of the data packet, other than the access code preamble 402 or lesser significant bits, the gain may be held generally constant to facilitate reliable demodulation of the data packet. In certain circumstances, the receiver does not have any prior information about an appropriate gain level for amplification of the receive signal or any prior information on the anticipated signal strength of the received signal. Nevertheless, the receiver is required to demodulate the data correctly with minimal or no prior information on the appropriate gain level. Although the initial gain of the amplifier 102 may be based on the reception of a previous data packet (e.g., a Bluetooth compliant data packet 300), a later data packet may be transmitted from a different transmitter or a different location, which may require different levels of gain for proper reception of an earlier data packet versus a later data packet.

In step 500, the gain of the amplifier 102 or other amplifiers may be controlled by gathering feedback from an intermediate stage of a filtering arrangement 202 of a demodulator 110 to generate a control signal to adjust the controlled gain during an access code preamble duration or a data packet preamble duration of the data packet (e.g., a Bluetooth compliant data packet 300). The gain controller 114 extracts at least partially filtered data from the filtering arrangement 202 for adjusting amplification of the received signal. The filtering arrangement 202 may represent a low-pass filtering arrangement to reduce or eliminate noise and other unwanted artifacts from the received signal. Accordingly, an intermediate output of the filtering arrangement 202 may form a reliable basis for accurately and rapidly controlling the gain of the amplifier 102 in a manner that does not entail the same degree of signal delay as would a control signal derived from the final output (i.e., output frame of the second filter) of the filter arrangement 202.

In step 502, a downconverter 104 or at least one mixer derives a lower frequency signal by down-converting the received signal. For example, a first mixer 118 and a second mixer 120 of the downconverter 104 may multiply or mix a first local oscillator signal with the received signal and a second local oscillator signal with the received signal, where the first oscillator and the second oscillator are offset in phase by a constant phase (e.g., 90 degrees). The lower frequency signal may represent an intermediate frequency or a baseband frequency.

In step 504, at least one analog-to-digital converter 108 converts the derived lower frequency signal into a digital baseband signal. In one embodiment, a pair of analog-to-digital converters 108 convert an I lower-frequency, analog signal and a Q lower-frequency analog signal into an I digital signal and a Q digital signal, respectively. The analog-to-digital converter 108 must have a sufficiently rapid response time to avoid delay in providing gain controlling feedback to the amplifier 102. For example, the response time of the analog-to-digital converter 108 must be sufficiently rapid when considered with other components of the receiver 100 so as to afford the destruction or corruption of no more than the first four bits or access code preamble 402 of a data packet (e.g., a Bluetooth compliant data packet 300) of the received signal.

In step 506, the demodulator 110 determines a compensatory direct current offset by evaluation of a group of trailing symbols, a defined sequence, or both of a data packet (e.g., a Bluetooth compliant data packet 300) of the received signal. In one example, the trailing symbols refer to four trailing bits within a trailer 406 of an access code 302 of a data packet, such as a Bluetooth-compliant data packet 300. In another example, the defined sequence refers to a Baker sequence of bits in a Bluetooth-compliant data packet 300. A Baker sequence may refer to the last seven bits of a received synchronization word. For example, the Baker sequence may be {0001101} or {1110010}. For an access code without a trailer 406, the last bits of the received synchronization word may be {101} or {010}.

In step 508, a demodulator 110 manipulates (e.g., adds) a compensatory direct current offset to a digital baseband signal to compensate for an unwanted direct current offset of the digital baseband signal, indicative of a frequency difference between the received signal and the transmitted signal. If the manipulation represents addition of the compensatory direct current offset to a digital baseband signal, the compensatory direct current offset may be configured to have a magnitude or magnitudal sign that is opposite to that of the unwanted direct current offset. If the manipulation represents subtraction of the compensatory direct current offset to a digital baseband signal, the compensatory direct current offset may be configured to have a magnitude or magnitudal sign that is the same as that of the unwanted direct current offset. Although the preamble symbols may be used to facilitate DC compensation, the receiver 100 may destroy or corrupt the preamble symbols while using other data in the data packet to determine the appropriate compensatory DC offset.

In step 510, a timing estimator of a matched filter 214 estimates the timing of a received signal with respect to a reference signal to determine a phase adjustment of the clock generator 208 associated with the detection of the received signal. The received signal includes the trailing symbols of the trailer, a defined sequence, or both. The trailer, the defined sequence, or combination of the trailer and the defined sequence represents a frequency estimation symbol pattern, a timing estimation symbol pattern, or both.

In one example, the estimation of step 510 may involve determining a correlation between the received symbol pattern (e.g., at least part of received synchronization word 404) of the received signal and the reference symbol pattern (e.g., at least part of reference synchronization word) of the reference signal to find a phase adjustment necessary to attain a peak correlation.

Figure 6:
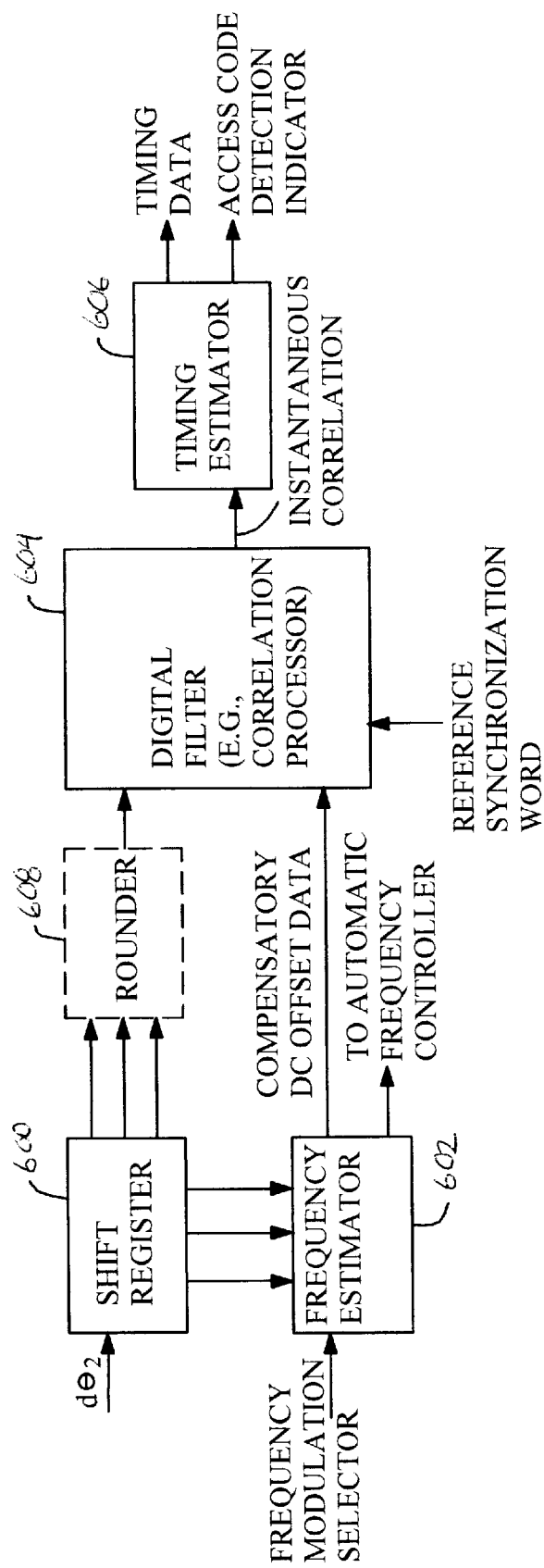
FIG. 6 is a block diagram of a matched filter, consistent with the demodulator of FIG. 2.

FIG. 6 illustrates the matched filter 214 within the 110 demodulator of FIG. 2. The matched filter 214 receives the output from the summer 204 or the FIR equalizer 206. The matched filter 214 includes a shift register 600 and a frequency estimator 602 coupled to a digital filter 604. The digital filter 604 has an output associated with a timing estimator.

In FIG. 6, the matched filter 214 provides a frequency estimation to promote reliable demodulation of the received signal. A shift register 600 stores a digital signal which corresponds to at least part of an access code (e.g., a trailer) or another received evaluation word of a data packet of a received signal. The digital filter 604 stores digital signals which correspond to synchronization word (i.e., sync word portions). A frequency estimator 602 determines an unwanted direct current offset from the received frequency evaluation word. The frequency estimator 602 is adapted to generate a compensatory direct current offset to add (or subtract) to the bits of the data word in the register prior to processing by the data slicer 212 to compensate for the unwanted direct current offset.

In one embodiment, the frequency estimator 602 comprises a data processor and memory associated with the data processor. The data processor compares the direct current offset of the received frequency evaluation word to a direct current offset associated with a reference frequency evaluation word to determine the unwanted direct current offset. For example, the data processor determines a first average magnitude of a digital baseband signal modulated with the received frequency evaluation word. The data processing determines a second average magnitude of a reference digital baseband signal modulated with a reference frequency evaluation word. The data processor takes a difference between the first average magnitude and the second average magnitude as an unwanted direct current offset of the baseband digital signal. The frequency estimator 602 is adapted to apply the compensatory direct current offset of approximately equal and opposite magnitude to the unwanted direct current offset to reduce or eliminate the unwanted direction current offset.

The frequency estimator 602 may take an average of the samples of the baseband signal, via the received frequency evaluation word, about a DC reference point such as zero volts (DC). The frequency estimator 602 may assume that the digital baseband signal has a certain waveform of a pulse train or a specified pattern (e.g., alternating sequence) of symbols. For an anticipated waveform or pattern of symbols, the average magnitude (e.g., mathematical mean or root-mean-squared value) of that waveform is known or capable of estimation if a known sample sequence of bit stream modulates the baseband signal. For example, if the received baseband signal is modeled as a differential square wave, then the mathematical average or geometric mean of the samples should be approximately equal to zero for an alternating sequence of symbols (e.g., a repetitive sequence of a 0 followed by a 1, or vice versa). The received evaluation word may represent a portion of the synchronization word that contains an alternating bit sequence, such as the defined sequence or the trailer. To the extent that the average of the waveform is different from zero, a compensatory DC offset may be required.

Over a certain interval, the frequency estimator 602 determines the compensatory DC offset to counteract any unwanted deviation from the expected or desired DC value and magnitude. In one example the frequency estimator 602 may determine a compensatory DC offset value that adds a positive DC offset value to each sample to compensate for an undesired DC offset of approximately equal value. In another example the frequency estimator 602 may determine a compensatory DC offset which is negative to counteract an undesired DC offset value. The DC offset values are processed and manipulated in the digital time domain for convenience, although there may be a direct proportional relationship between the DC offset and any unwanted frequency deviation or phase difference between the transmit signal and the received signal.

In FIG. 6, the matched filter 214 provides a timing estimation to promote reliable demodulation of the received signal in accordance with the invention. A shift register 600 stores an input of a digital signal indicative of differential phase of a received signal. A digital filter 604 receives extracted, selected bits of a data word in the shift register 600 as outputs to form a received symbol pattern (e.g., at least part of received synchronization word 404). The digital filter 604 provides an instantaneous correlation between the received symbol pattern (e.g., at least part of or all of received synchronization word 404) and a reference symbol pattern (e.g., at least part of or all of a reference synchronization word).

For example, the digital filter 604 accepts the input of a synchronization word, where the compensatory DC offset, and a shift register 600 input and produces an instantaneous correlation as an output. The digital filter 604 is coupled to a timing estimator 606. The timing estimator 606 may provide an initial timing signal that determines whether a time or phase adjustment to the clock generator 208 is necessary. The timing estimator 606 may also provide an access code 302 detection indicator. The access code 302 detector indicator may be high for a detection of access or low.

In the timing estimator 606, a peak detector determines if the instantaneous correlation represents a peak of a group of the instantaneous correlations to determine a corresponding timing factor associated with maintenance of the peak on an on-going basis. A clock generator 208 receives a phase adjustment, as the timing factor, from the peak detector. The peak detector identifies the peak by analyzing instantaneous correlations associated with temporally offset registering of samples of the received symbol pattern (e.g., at least part of received synchronization word 404) with respect to bits of the reference symbol pattern (e.g., at least part of reference synchronization word) to determine an overall pattern of instantaneous correlations associated with corresponding temporal offsets.

A frequency estimator 602 outputs a compensatory direct current offset to each sample of the received symbol pattern (e.g., at least part of received synchronization word 404) to compensate for at least one of unwanted frequency offset in the received signal or baseband signal. The frequency estimator 602 outputs an initial estimated frequency data to the automatic frequency controller 210 and a compensatory DC offset value to the digital filter 604 for adjusting the DC offset of the baseband signal. The compensatory direct current offset is selected to reduce or eliminate any unwanted direct current offset in the digital baseband signal. The output of the summer feeds into a shift register 600. The shift register 600 contains a maximum number of bits or symbols that range from a least significant bit assembled to a most significant bit or symbol. The shift register 600 may be coupled to the digital filter 604 via a rounder 608 that truncates one or more least significant bits to conserve storage space of the digital filter 604. The shift register 600 permits the values of symbols to be extracted from different positions in the shift register 600 such that a symbol fed into a digital filter 604 is offset a predetermined amount of places or symbols in the shift register 600 with respect to a symbol inputted into the frequency estimator 602. In one embodiment, the digital filter 604 receives a symbol from an intermediate position (e.g. $T_{12}$) within the shift register 600. Further, in one embodiment, the frequency estimator 602 is associated with inputs of the shift register 600 that accepts symbols from the following positions in the shift register 600: $T_2$, $T_{10}$ and $T_{18}$.

The data bits in the shift register 600 are preferably updated in a continuous manner as the received signal is received at the receiver 100 from the transmitter such that values in a stationary or fixed position in the shift register 600 changes.

Figure 7:
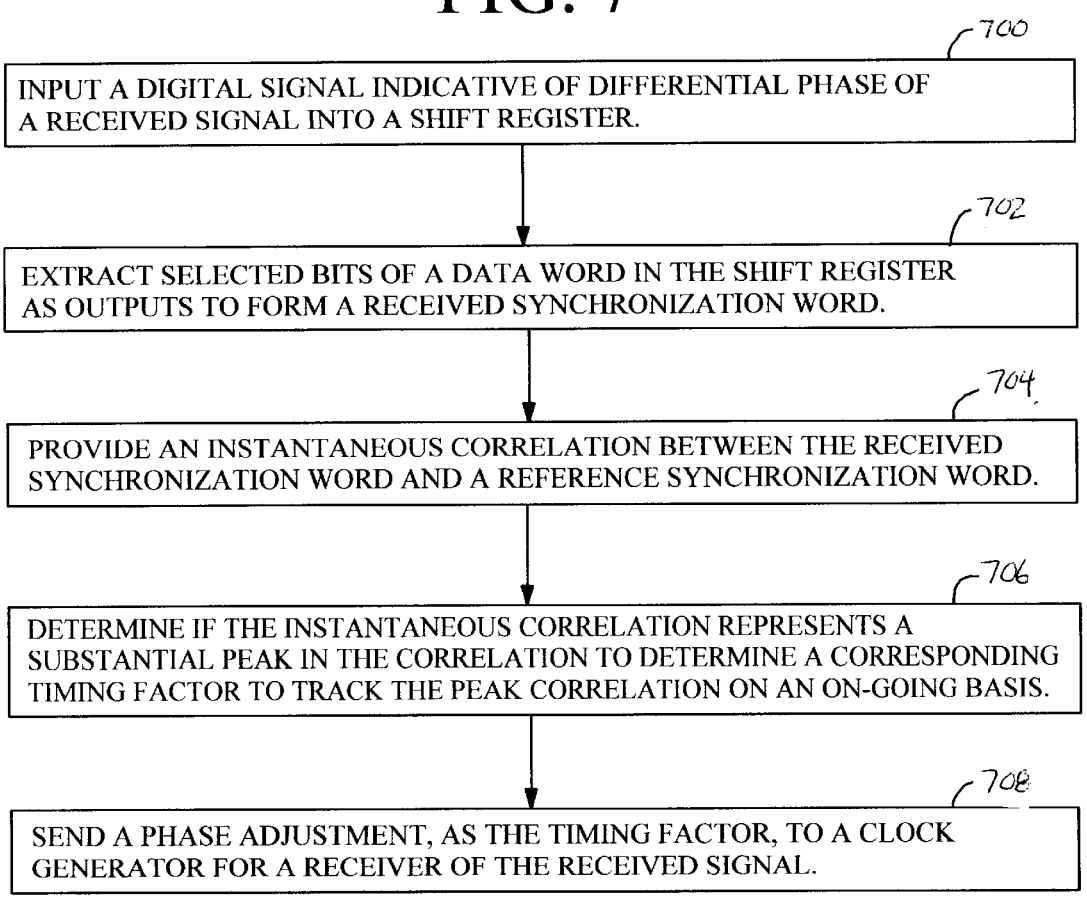
FIG. 7 is flow chart of a method for determining a timing factor for synchronization of a received signal to a transmitted signal.

FIG. 7 shows a method for providing a timing estimation in a demodulator. The method starts in step 700. In step 700, a demodulator component (e.g., a summer 204 or an FIR equalizer 206) inputs a digital signal indicative of differential phase of a received signal into a shift register 600. In one example, the inputted signal may originate from the output of a differential phase detector 200 which is summed with an automatic frequency control component in a summer 204.

In step 702, a rounder 608 or a digital filter 604 extracts or accepts selected bits of a data word in the shift register 600 to form a received symbol pattern (e.g., at least part of received synchronization word 404). The received symbol pattern may represent a subcomponent of the received synchronization word 404. The received symbol pattern may represent an end portion of the most significant bits of an access code, a defined sequence of an access code 302, or an end portion of a received synchronization word of a Bluetooth-compliant data packet 300. For example, the received symbol pattern may represent trailing bits of a trailer 406 of an access code 302 of a data packet (e.g., a Bluetooth compliant data packet 300) or at least part of Baker sequence of a data packet (e.g., a Bluetooth compliant data packet 300) in the absence of the trailing bits.

In step 704, a digital filter 604 (FIG. 6) provides an instantaneous correlation between the received symbol pattern (e.g., at least part of received synchronization word 404) and a reference symbol pattern (e.g., at least part of reference synchronization word). A compensatory direct current offset may be added to each sample of the received symbol pattern (e.g., at least part of received synchronization word 404) to compensate for unwanted frequency offset in the received signal. For example, an frequency estimator 602 (FIG. 6) provides the offset to the digital filter 604.

In the digital filter 604, the following processing may occur as will be described in greater detail in conjunction with FIG. 9. First, a summer may manipulate (e.g., add) a compensatory direct current offset to an absolute value of a sample of a received symbol of the received signal to reduce or eliminate a frequency offset of the received signal caused by the frequency of a local oscillator or otherwise. The sample may be stored in and retrieved from a shift register 600 or another storage device. Second, a converter converts the compensated sample in a shift register 600 from an absolute level to a logic level. For example, the converter may refer to an SGN signal processing function. Third, the converter inputs the logic level into one input of an exclusive OR gate 900. Fourth, a reference bit of a reference symbol pattern (e.g., at least part of reference synchronization word) is inputted into another input of the exclusive OR gate 900. The reference symbol pattern (e.g., at least part of reference synchronization word) is stored in register or another storage device, and may be consistent with the data protocol and structure of the data packet (e.g., a Bluetooth compliant data packet 300) of the receiver 100. Fifth, a summer sums an inverted output or another output of a group of exclusive OR gates 900 to derive an instantaneous correlation within a range of zero to a total number of the outputs taken from the shift register 600.

In step 706, a timing estimator 606 (FIG. 6) determines if the instantaneous correlation represents a substantial peak in the correlation to determine a corresponding timing factor to track the peak correlation on an on-going basis. In one example, the timing estimator 606 identifies the peak by analyzing instantaneous correlations associated with temporally offset registering of samples of the received symbol pattern (e.g., at least part of received synchronization word 404) to bits of the reference symbol pattern (e.g., at least part of reference synchronization word) to determine an overall pattern of instantaneous correlations associated with corresponding temporal offsets. The timing estimator 606 may comprise an over-threshold trigger 1006 that establishes a minimum threshold as a sufficient instantaneous correlation to justify a finding that the received signal (or its derivative) and digital signal processing operation of the receiver 100 are coordinated and properly synchronized.

In step 708, the timing estimator 606 may send a phase adjustment, as the timing factor, to a clock generator 208 for a receiver 100 of the received signal.

Figure 8:
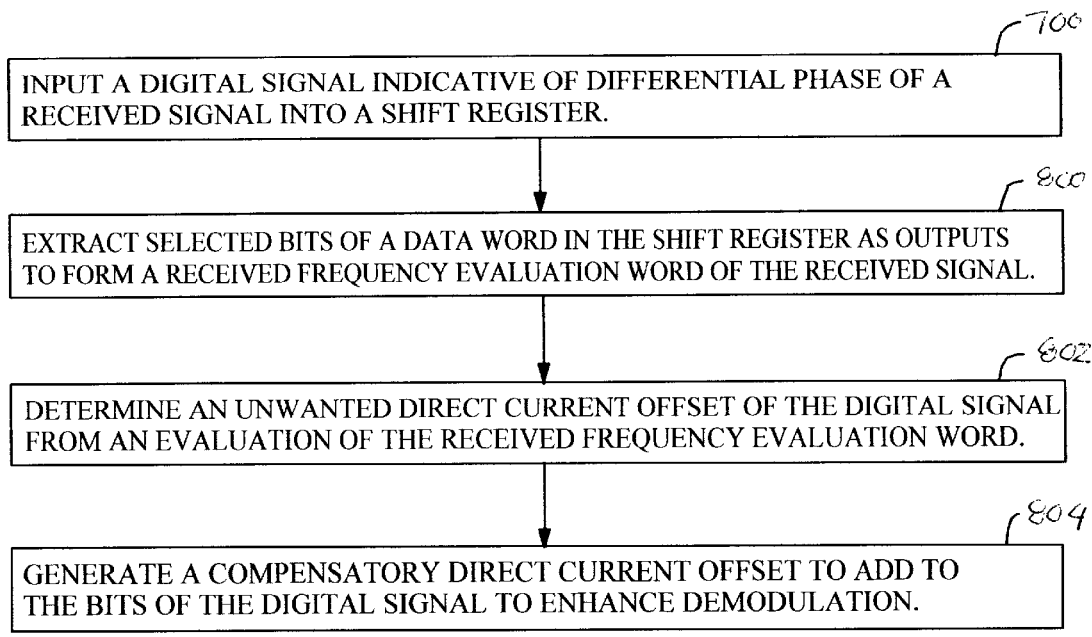
FIG. 8 is a flow chart of a method for determining a compensatory correction for compensating for any possible misalignment of the local oscillator frequency of the receiver.

FIG. 8 shows a method for providing a frequency estimation in a demodulator. The method of FIG. 8 starts in step 700. In step 700, a demodulator component (e.g., a summer 204 or an FIR equalizer 206) inputs a digital signal indicative of differential phase of a received signal into a shift register 600. In one example, the inputted signal may be originate from the output of a differential phase detector 200 which is summed with an automatic frequency control component in a summer 204.

In step 800, a frequency estimator 602 (FIG. 6) extracts or accepts selected bits of a data word in the shift register 600 to form a received frequency evaluation word of the received signal. In step 802, the frequency estimator 602 determines an unwanted direct current offset of the digital signal from an evaluation of the received frequency evaluation word. In one example, the frequency estimator 602 compares a first direct current offset of the received frequency evaluation word to a second direct current offset, if any, associated with a reference frequency evaluation word to estimate a difference between the first direct current offset and the second direct current offset. The estimated difference indicates the unwanted direct current offset. The compensatory direct current offset may have an opposite magnitudinal sign to that of the unwanted direct current offset to facilitate cancellation of the unwanted direct current offset by destructive addition of the compensatory and undesired signals.

In another example, the frequency estimator 602 determines a first average magnitude of the symbols of the digital signal modulated with the received frequency evaluation word. The frequency estimator 602 references a second average magnitude of the symbols of a reference digital baseband signal modulated with a reference frequency evaluation word. The frequency estimator 602 determines a difference between the first average magnitude and the second average magnitude to estimate an unwanted direct current offset of the baseband digital signal.

In step 804, the frequency estimator 602 generates a compensatory direct current offset to add to the digital signal to enhance demodulation. The compensatory direct current offset may have approximately equal and opposite magnitude to the unwanted direct current offset to the digital signal to reduce or eliminate the unwanted direct current offset. The compensatory direct current offset may be negative or positive in value.

Figure 9:
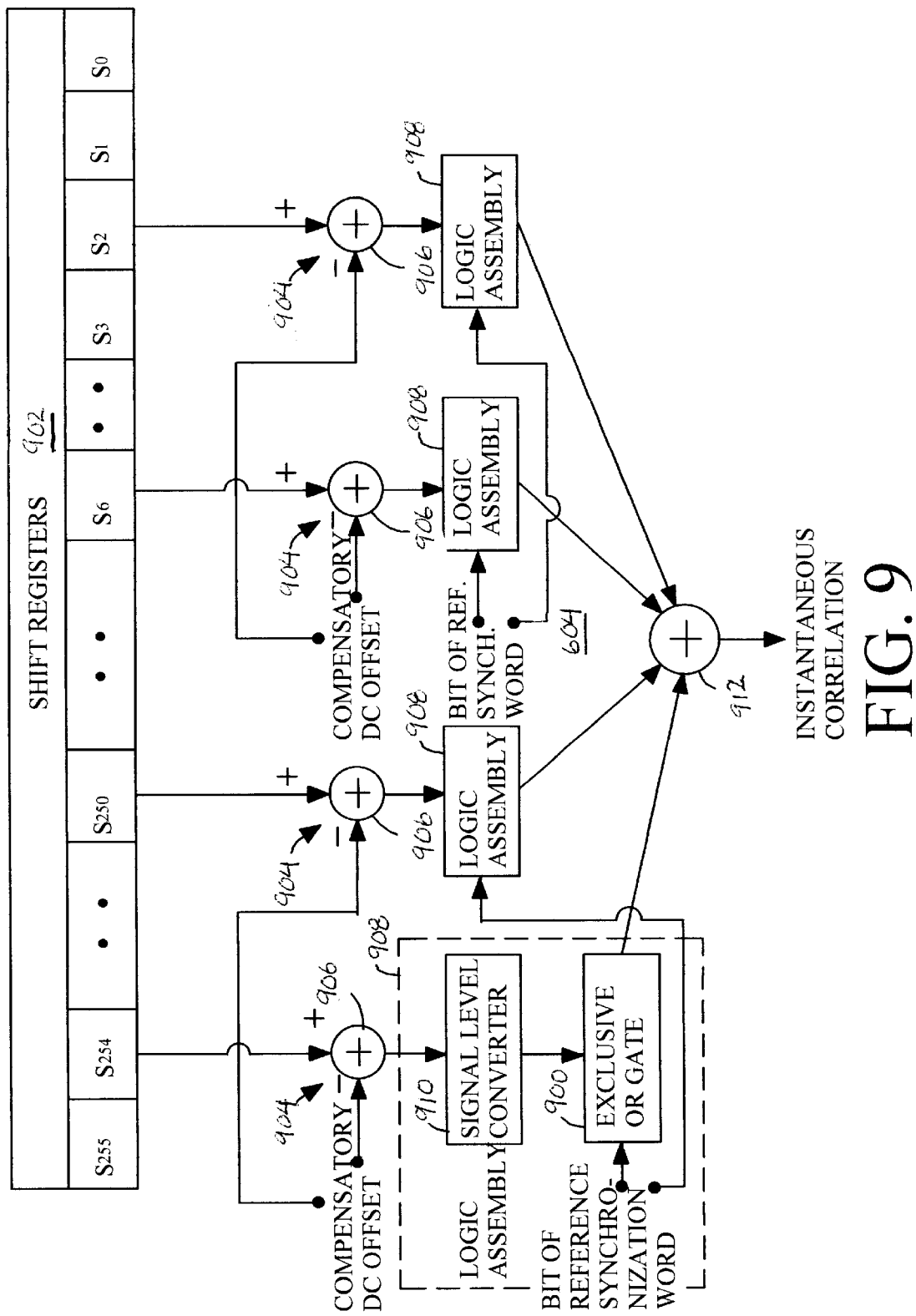
FIG. 9 is a block diagram illustrating a digital filter of the demodulator of the receiver of FIG. 1.

The digital filter 604 of the demodulator is illustrated in FIG. 9 in greater detail. The digital filter 604 may include a shift register 902 that has different symbol positions tapped or accessible to extract samples of symbol values that are offset from each other in a data word. The shift registers 902 may be used to store a received symbol pattern (e.g., at least part of received synchronization word 404), for example. The digital filter 604 includes a group of signal paths 904 or taps, which tap into various positions or memory locations of a shift register 600 or another storage device. Each signal path 904 of the digital filter 604 includes a compensatory manipulator (e.g., summer 906) and a logic assembly 908. Each logic assembly 908 includes a signal level converter 910 and a logic device, such as an exclusive OR gate 900 or the combination of an exclusive OR gate 900 and an inverter. A multiport summer 912 sums the outputs of each signal path 904 to provide an instantaneous correlation.

Each compensatory manipulator (e.g., summer 906) has two inputs and an output. In one embodiment, the first input of each summer 906 is coupled to one output (e.g., $S_{254}$) of the shift register 902 and the second input is associated with a value of a compensatory DC offset from the frequency estimator 602. The correlation includes a compensatory DC offset to the received symbol pattern (e.g., at least part of received synchronization word 404) to adjust for any phase or frequency difference between the transmitter and the receiver 100. The output of the summer 906 or the compensatory manipulator feeds a synchronization assembly.

In the logic assembly 908, a signal level converter 910 converts the compensated sample into a logic level input. An exclusive OR gate 900 accepts the logic level input and inputs the reference bit of a synchronization word into another input of the OR gate. In one embodiment, an inverter is coupled to each corresponding exclusive OR gate 900. A multiport summer 912 may sum a group of inverter outputs to derive an instantaneous correlation within a range of zero to a total number of outputs taken from the shift register 600.

In one embodiment, the logic assembly 908 may comprise a SGN function as the signal level converter 910. The signal level converter 910 converts a signal from an absolute value or another reference value to a logic level that is understood by the exclusive OR gate 900. The exclusive OR gate 900 has another input which accepts a reference symbol pattern (e.g., at least part of reference synchronization word). If the bit of the reference symbol pattern (e.g., at least part of or all of a reference synchronization word) matches the corresponding bit of the received symbol pattern (e.g., at least part of or all of a received synchronization word 404), then the output of the synchronization assembly is a zero to the summer. The output of the exclusive OR gate 900 follows an ordinary exclusive OR truth table in which a low logic level at one input and a high logic level at another input produce a high logic level output; in which all other logic level inputs produce a low logic level output for the output. The summer provides an instantaneous correlation of the received symbol pattern (e.g., at least part of received synchronization word 404) of the baseband signal with reference to the synchronization word. The shift register 902 of the digital filter 604 preferably have outputs that represent taps into the register every X samples, where X is the extent of samples per symbol bit, byte or word for oversampling. As illustrated in FIG. 9, four samples per bit so X may equal four. That is, each of four adjacent representations or samples in the register of FIG. 9 may represent one bit. Thus, the samples in the shift register 600 of FIG. 9 may be shifted four consecutive times during four successive intervals until all samples per bit or symbol are checked. A correlation is calculated at least once for each bit or preferably once per each sample. The correlation value may range from zero to 64 for a corresponding 64 bit long received synchronization word. If synchronization words for all samples are identical to the samples, then the instantaneous correlation from each exclusive OR gate 900 may be zero.

In an alternate embodiment, to produce a value of 64 for the highest correlation the output of the exclusive OR 900 may be inverted or fed into a NOT logic device. If the inversion is used, then a output of the summer indicates an instantaneous correlation of 64 where each of the reference synchronization samples, words, or symbols matches the corresponding samples or symbols in the shift register 902 of the digital filter 604. The output of the digital filter 604 (e.g., a correlator) is coupled to at least one of a peak-shaping assembly 1000 and a temporal sampling organizer 1002 of the timing estimator 606 for reliably preparing a set of correlations for detection of a general peak of the set.

Figure 10:
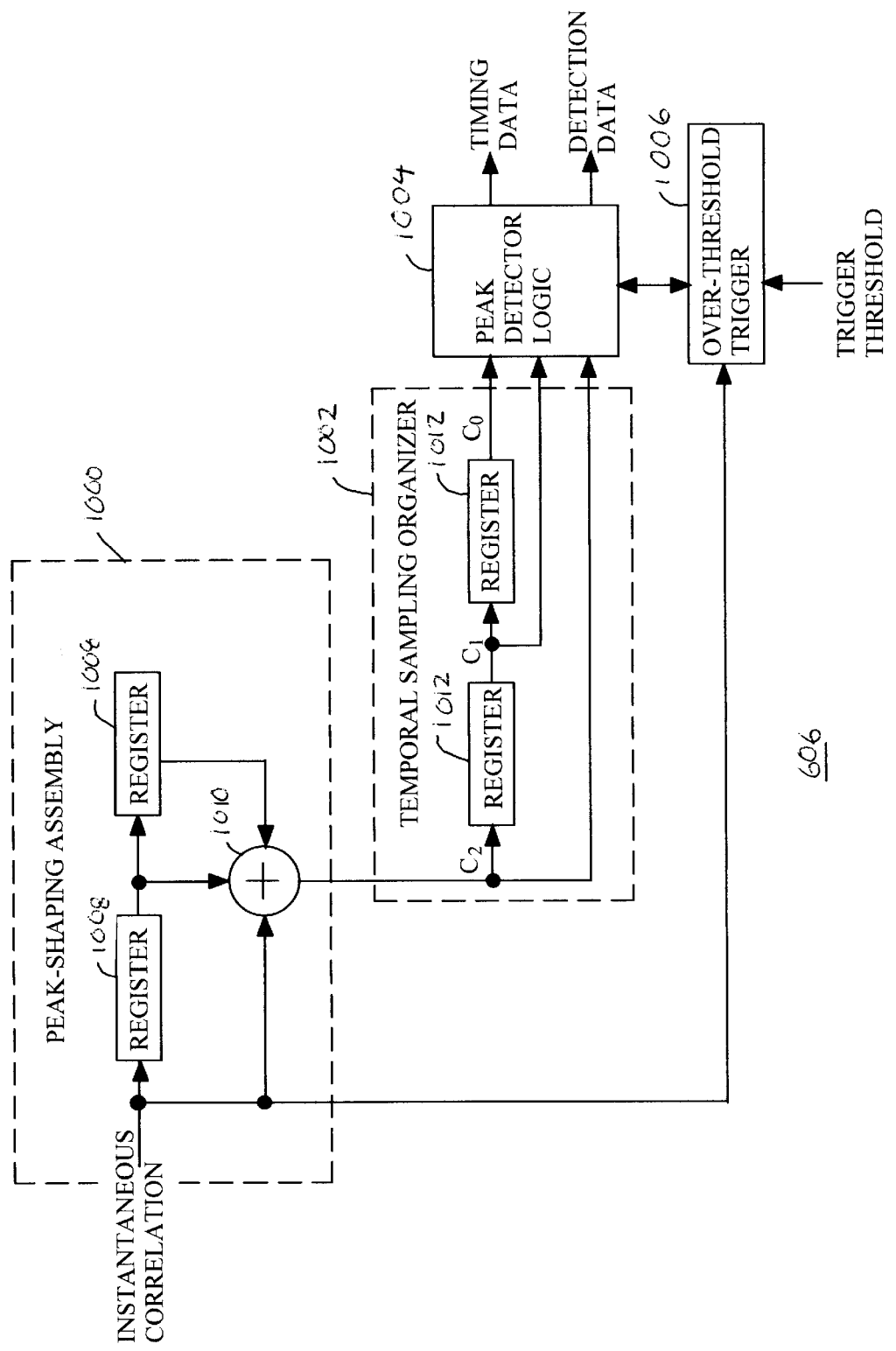
FIG. 10 is a block diagram illustrating a timing estimator of the demodulator of the receiver of FIG. 1.

In FIG. 10, the timing estimator 606 includes a peak-shaping assembly 1000 for defining or emphasizing the instantaneous correlation as a peak of correlation versus time. For example, the peak-shaping assembly 1000 may emphasize the instantaneous correlation or a set of instantaneous correlations as a peak of correlation versus time in preparation for application of the instantaneous correlation to the peak detector logic 1004. A temporal sampling organizer 1002 is coupled to the peak-shaping assembly 1000. The temporal sampling organizer 1002 organizes instantaneous correlations in a temporal sequence for application to peak detector 1004.

An over-threshold trigger 1006 detects whether or not the instantaneous correlation from the digital filter 604 is greater than or equal to some minimum threshold. If the instantaneous correlation is greater than or equal to a first threshold, the over-threshold trigger 1006 instructs the peak detector logic to assume the presence of a peak, without resort to the evaluation of the temporal sequence of different correlations. Accordingly, the over-threshold trigger 1006 reduces the processing time and/or resources that would otherwise be necessary for proper operation of the timing estimator 606.

If the instantaneous correlation is less than the first threshold and greater than or equal to a second threshold, the peak detector starts evaluating the temporal aspects of the peak correlation to adjust the clock phase. However, if the correlation is less than the second threshold, the peak detector does not evaluate the temporal aspects of the peak correlation.

The instantaneous correlation from the digital filter 604 is fed to the timing estimator 606. The peak shaping assembly 1000 may comprise a tandem arrangement of registers 1008 that are summed by a summer 1010 to emphasize or sharpen the peak of the instantaneous correlation of the baseband signal. For example, the peak-shaping assembly 1000 may convert a boxy or square wave pulse inputted from a digital filter 604 into a more pointed, peaked, or angular pulse representative of the instantaneous correlation. The shape of the instantaneous correlation is represented as a correlation versus time response.

The peak-shaping assembly 1000 is coupled to a temporal sampling organizer 1002 or dissecting register arrangement that extracts different temporal components (e.g., successive samples of instantaneous correlations). As shown the dissecting registers 1012 extract a current sample of the instantaneous correlation, a past sample of the instantaneous correlation and a prior sample that is older than the past sample. The three distinct temporally related correlations or any other appropriate number are fed into the peak detector logic and timing settings. The temporal sampling organizer 1002 contributes toward more accurate and consistent detection of general peaks of instantaneous correlation by dissecting a successive set of instantaneous correlations to reduce incidences of false detection of peaks by the peak detector logic 1004.

The peak detector logic 1004 determines whether the samples present a function in the time versus magnitude domain that indicates a peak or another non-peak waveform. The output of the peak detector is an initial timing signal that may or may not provide an adjustment of the phase of the clock generator 208 as input depending upon the detection of a peak.

A peak detector 1004 identifies the temporal aspects of correlation peaks in the phase differential output or another signal representative of the received signal. The peak detector 1004 sends the temporal aspects as initial timing to adjust the timing of a clock generator 208 such that the data slicer 212 samples the data at the optimum times or positions in the signal response. The timing of the clock generator 208 may be shifted in phase based on the initial timing to maximize the instantaneous correlation between the reference symbol pattern (e.g., at least part of reference synchronization word) and a received symbol pattern (e.g., at least part of received synchronization word 404) representative of the received baseband signal.

The timing estimator 606 may be equipped with an over-threshold trigger 1006 that bypasses the rest of the timing estimator 606 if the instantaneous correlation does not exceed a certain threshold value. The peak detection logic 1004 is not necessary to determine the initial timing for the clock generator 208 if the correlation does not exceed a certain threshold value.

Figure 11:
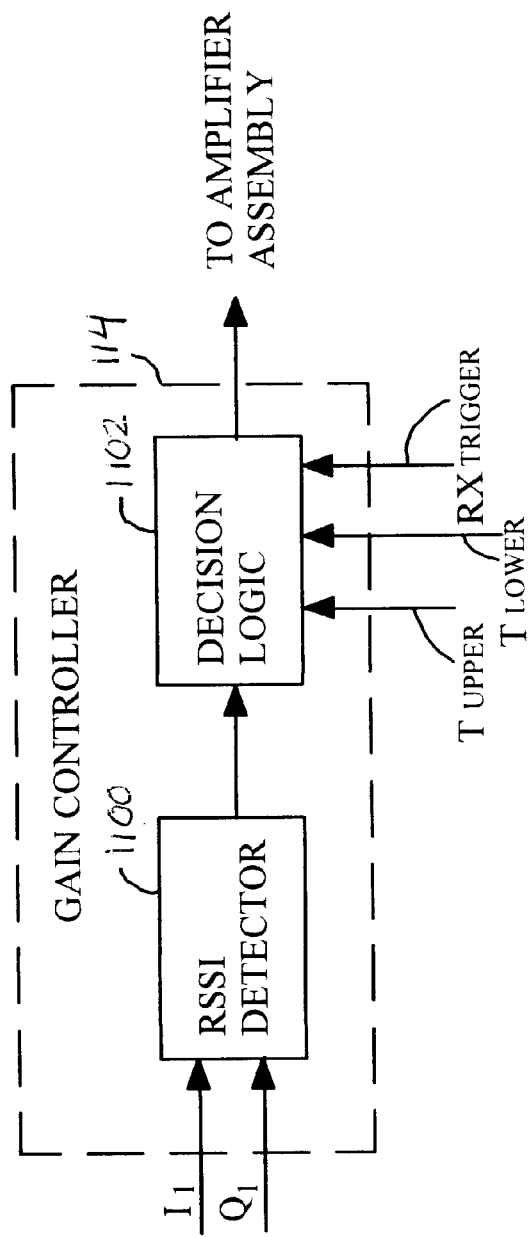
FIG. 11 is a block diagram illustrating the gain controller of the receiver of FIG. 1

FIG. 11 shows a block diagram of one embodiment of the gain controller 114, which may include a receive signal strength indicator 1100 coupled to decision logic 1102. The receive signal strength indicator may be incorporated into a demodulator of the receiver 100 so as to indicate relative signal strengths of received signals.

FIG. 11 shows the gain controller 114 which includes an instantaneous receive signal strength indicator 1100 coupled to decision logic 1102. In turn, the decision logic 1102 may provide a control signal for controlling the amplifier 102. For example the control signal may provide an ON signal or an OFF signal for the amplifier 102 or signals to control the variable gain or signals to control the activation of switches that place the amplifier 102 in a receive signal path of the receiver 100. The instantaneous receive signal strength accepts the I baseband digital signal and the Q baseband digital signal and provides a receive signal strength indication as output.

The received signal strength indicator output is a logical indication that represents the measured or detected RSSI of the received signal. The logic level may have one value if the receive signal strength is too low or beneath a certain defined threshold and another logic level if the receive strength indicator is too high or above a certain receive signal level. In one embodiment, the received signal strength indicator (RSSI) measures signal amplitude or instantaneous received signal strength (RSS) in accordance with the following equation:

$$RSS = MAX\{|I_1|, |Q_1|\} + 0.5\ MIN\{|I_1|, |Q_1|\}$$

The foregoing equation provides a figure of merit for the amplitude of a signal.

Figure 12:
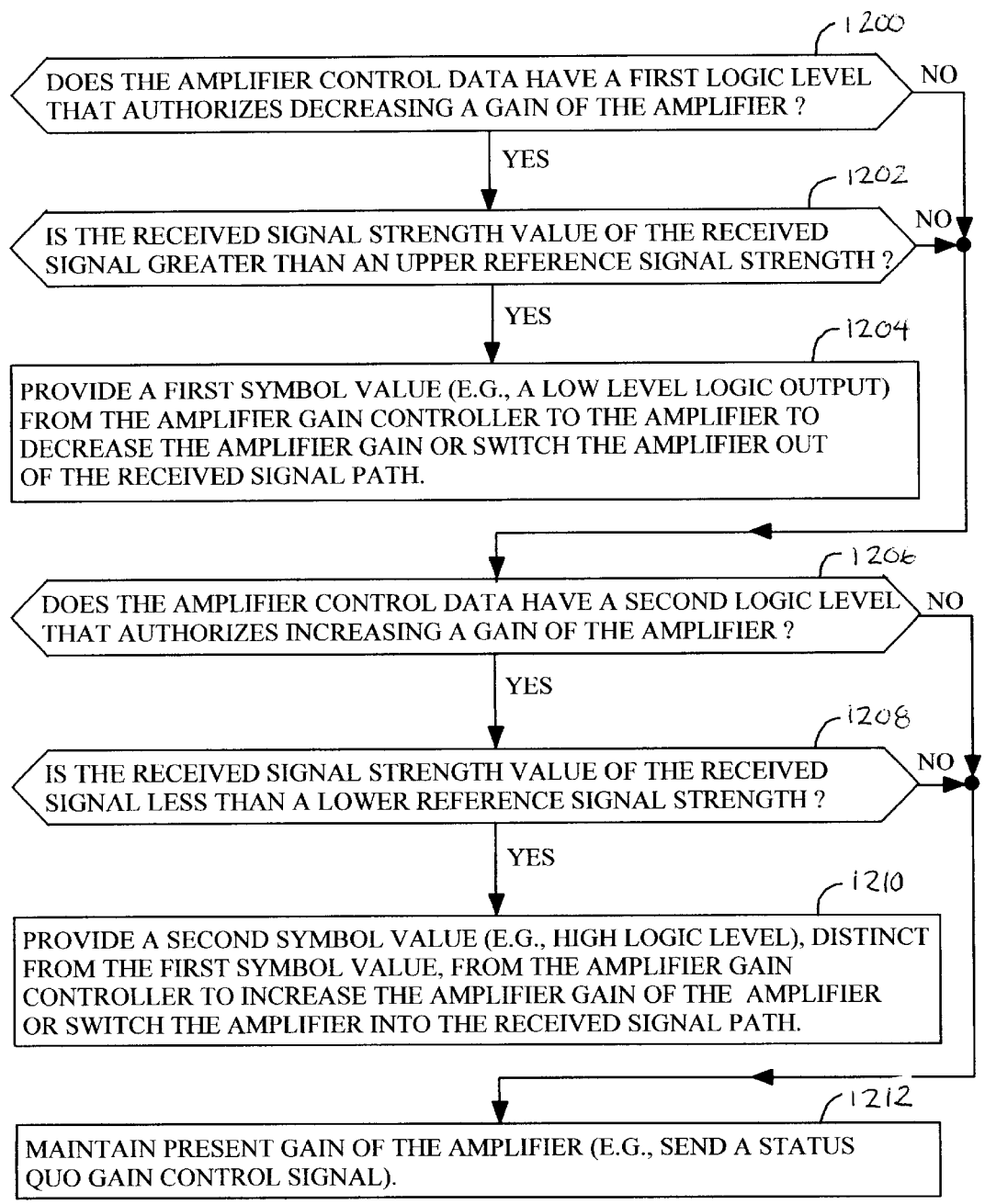
FIG. 12 is a flow chart of a method for controlling target gain of an amplifier.

The decision logic 1102 may apply to the following procedure that is illustrated n FIG. 12. The method of FIG.12 starts in step 1200 and may be applied to receivers hat operate under an open standard such as Bluetooth or some other communication standard.

In step 1200, if the amplifier control data has a first logic level that authorizes decreasing the gain of the amplifier (e.g., amplifier assembly 102), the method continues with step 1202. In one example, the first logic level may authorize decreasing he gain of the amplifier during a preamble duration. The preamble duration refers to a duration of an access code preamble, a duration of an access code, a duration of a data packet preamble, or any combination of the foregoing items that are consistent with each other. If the amplifier control data does not have a first logic level that authorizes decreasing of the gain of the amplifier, the method continues with step 1206.

In step 1202, if the receive signal strength indication data is greater than an upper reference signal strength, then the method continues with step 1204. However, if the receive signal strength indication data is less than or equal to the upper reference signal strength, the method continues with step 1206.

In step 1204, the amplifier gain controller 114 provides a first symbol value (e.g., a low level logic output) to the amplifier (e.g., amplifier assembly 102) to decrease the amplifier gain or switch the amplifier out of the received signal path. For example, the amplifier gain is decreased or switched out of the received signal path during the preamble duration.

In step 1206, if the amplifier control data has a second logic level that authorizes increasing a gain of the amplifier (e.g., amplifier assembly 102), the method continues with step 1208. For example, the amplifier control data may have a second logic level that authorizes increasing a gain of the amplifier during the preamble of a data packet. The second logic level may be the opposite of the first logic level. If the amplifier control data does not have the second logic level that authorizes increasing a gain of the amplifier the method continues with step 1212.

In step 1208, if the receive signal strength value of the received signal is less than a lower reference signal strength, the method continues with step 1210. However, if the receive signal strength value of the received signal is not less than a lower reference signal strength, the method continues with step 1212.

In step 1210, the amplifier gain controller provides a second symbol value (e.g., a high logic level) distinct from the first symbol value to the amplifier (e.g., the amplifier assembly 102), to increase the amplifier gain of the amplifier or switch the amplifier into the received signal path. For example, the amplifier gain may be increased or switched into the received signal path during a preamble duration.

In step 1212, the amplifier controller 114 maintains a present gain of the amplifier. For example, the amplifier controller may send a status quo gain control signal such that the amplifier gain remains unchanged. One or more steps of the above procedure of FIG. 12 may be executed in a manner such that the amplification gain or amplification state is frozen once the receiver 100 detects an access code 302 before the body of data and the received signal to avoid a transient that disrupts the demodulation process. Accordingly, the amplification setting may be maintained for the duration or the rest of the data packet after the access code 302 of the data packet is detected such that the gain is kept constant for all of the data in the body of the data packet.

In the context of the Bluetooth standard, the method of FIG. 12 and the gain controller 114 supports independent setting of gain or amplification for each data packet regardless of what the previous gain or setting of the prior data packet was. Nevertheless, the gain controller 114 preferably maintains the gain throughout the reception of data packets after the access code (associated with the data packet) is decoded to maintain the gain throughout the reception of a data packet after the access code is decoded to avoid any disruption in the transient that may be introduced by a switching of an amplifier 102 into the received signal path. Thus, the configuration of the present invention supports a reliable operation of gain adjustment for the amplifier 102 or the receiver 100 to maintain a sufficiently reliable signal that falls within a desired range of signal strengths or indicates another criteria that is representative of a reliable signal.

Each time a transmitter sends a packet in accordance with an open standard such as the Bluetooth standard, an access code is sent as an integral portion of the data packet. If the access code matches a reference code in the receiver, the decoder decodes the data body. However, if the access code does not match, then the receiver ignores the data body. The frequency adjustment and the timing adjustment is done for each data packet in a quick manner without using store and hold to delay operation and data transfer for a user. Thus, relatively higher rates of efficiency in transfer are attainable through the procedure and amplification control scheme in the present invention than would otherwise be possible. Rather than taking a store-and-hold approach, the present amplification scheme and system works on the fly to determine dynamically the proper timing adjustment to adjust a phase of the clock signal of the clock generator and a proper frequency offset compensation in the digital domain. The reliability and accuracy of the demodulation process is enhanced by eliminating a potential distortion introduced by an unwanted DC offset in a baseband digital signal, while permitted the preamble of the received data packet to be destroyed or corrupted during a gain adjustment.

Although the amplification gain is preferably adjusted during the access code preamble 402 of a data packet under ideal circumstances to preserve data integrity of a data packet, in practice the receiver 100 may adjust the gain control of amplifier assembly 102 outside of the access code preamble 402 or even within the least significant bits of a synchronization word 404. In one embodiment, the receiver does not know where the burst of a data packet starts until it detects the access code 302 or component 400; hence, the gain control may adjust the gain prior to decoding the access code because of interference prior to or during a burst of the data packet.

Figure 13:
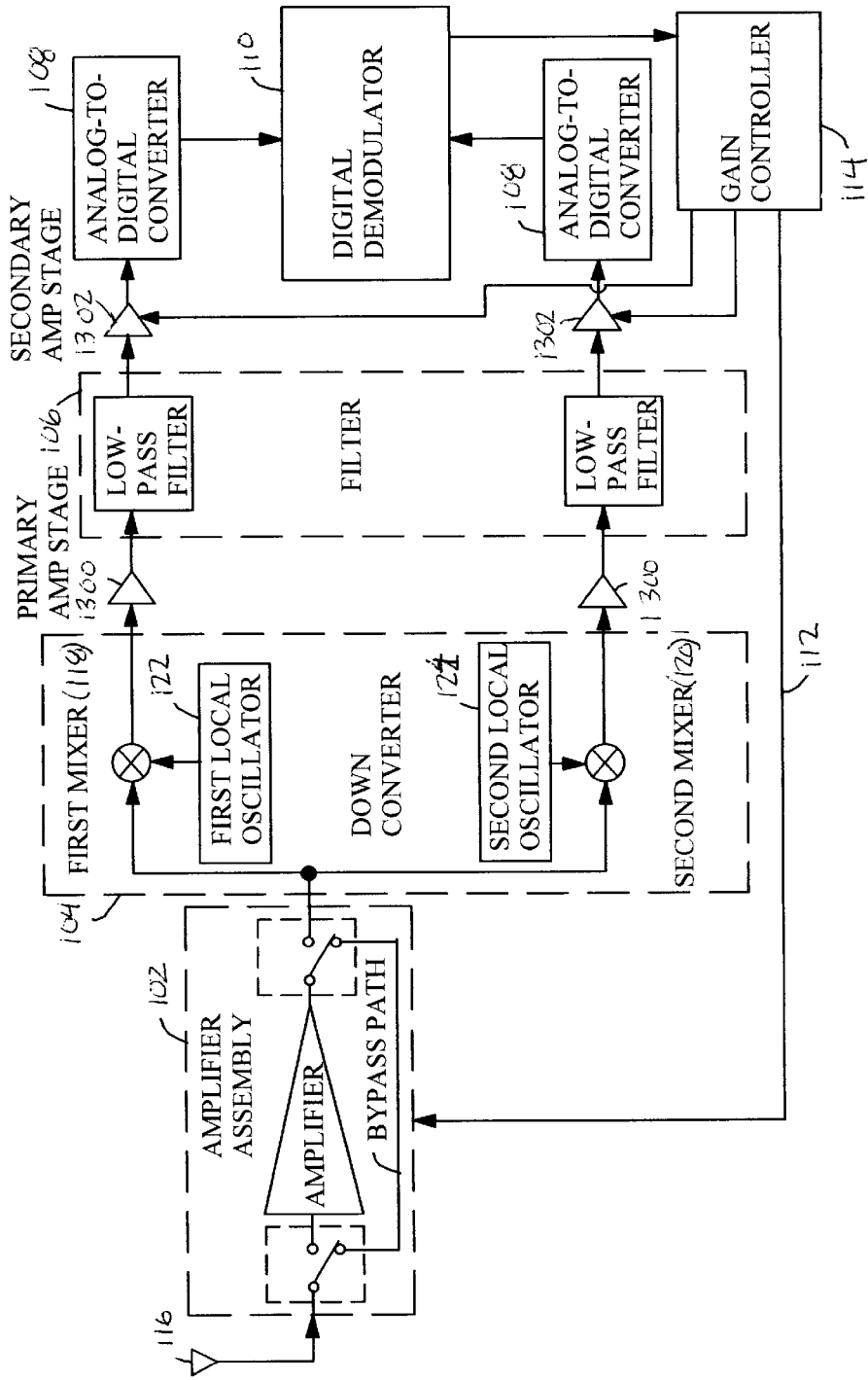
FIG. 13 is a block diagram of another embodiment of a receiver.

FIG. 13 is a block diagram of an alternate embodiment of a receiver in accordance with the invention. The receiver of FIG. 13 is similar to the receiver of FIG. 1, except the receiver of FIG. 13 includes a primary amplification stage 1300 and a secondary amplification stage 1302. Like reference numbers in FIG. 1 and FIG. 13 indicate like elements.

The primary amplification stage 1300 may include a first amplifier for amplifying an I baseband signal and second amplifier for amplifying a Q baseband signal. The secondary amplification stage 1302 may include a first amplifier for amplifying an I baseband signal and second amplifier for amplifying a Q baseband signal.

In one embodiment, the first amplification stage 1300 has a fixed gain, and the second amplification stage 1302 has a variable gain that may be adjusted by the gain controller 114. The gain controller 114 may adjust the gain to promote a wide dynamic range of received signals, while maintaining accurate demodulation of the received signal.

In an alternate embodiment, the first amplification stage 1300 has an adjustable gain. The gain controller 114 may adjust the gain of the first amplification stage in a similar manner to that of the second amplification stage.

The system and method of controlling amplification may be applied to a wide assortment of receivers in accordance with the invention to enhance the dynamic range (i.e., signal strength range) of reliable reception. For example, the invention and system may be applied to a conventional frequency modulation (FM) receiver, a Gaussian frequency-shift-keying (GFSK) receiver, a receiver with an intermediate frequency stage, a direct-conversion receiver, a Bluetooth receiver or another receiver. In a conventional FM or GFSK receiver, an intermediate frequency (IF) limiter-discriminator may be used to reduce some dependence of the demodulation of the received signal on signal strength. Although a gain control scheme is not essential for operation of the conventional FM or GFSK receiver, the gain control scheme of the invention may be used to maximize dynamic range of the conventional FM or GFSK receiver. In the context of a direct conversion receiver or receiver with a low intermediate frequency, the gain control scheme of the invention may be employed to achieve a proper dynamic range for reliable operation of the receiver. A Bluetooth receiver uses the gain control to facilitate reception of an incoming received signal without prior signal strength information on the incoming received signal. Accordingly, the Bluetooth receiver that incorporates the gain control scheme of the invention is well-suited for reliable reception over a broad dynamic range of signal strengths, typical of an environment where multiple signals are received from different Bluetooth transmitting devices at various locations. Further, the gain control scheme of the invention removes the dependence of reliable reception upon decoding of the preamble of a data packet of the received signal.

While various embodiments of the invention have been described, it will be apparent to those of ordinary skill in the art that many more embodiments and implementations are possible that are within the scope of this invention.

What is claimed is:

1. A method for controlling amplification in a receiver, comprising:

amplifying a received signal in accordance with a controlled gain to enhance the reliability of demodulating the received signal;

deriving a lower frequency signal by down-converting the received signal;

converting the derived lower frequency signal into a digital baseband signal;

determining a compensatory direct current offset that is caused by a frequency difference between the received signal and the transmitted signal by evaluation of one of trailing symbols and a defined sequence of an access code of a data packet of the received signal, wherein the compensatory direct current offset is determined without evaluating a preamble of the access code of the data packet; and manipulating a compensatory direct current offset with respect to a digital baseband signal to compensate for an unwanted direct current offset of the digital baseband signal, indicative of a frequency difference between the received signal and the transmitted signal.

2. The method according to claim 1, further comprising gathering feedback from an intermediate stage of a filtering arrangement of a demodulator to generate a control signal for controlling the controlled gain to adjust the controlled gain during a preamble duration of the data packet.

3. The method according to claim 1 further comprising:

filtering the digital baseband signal with a low-pass filtering arrangement; and extracting at least partially filtered data from the low pass filter arrangement to feed to a gain controller for adjusting amplification of the receive signal during a duration of the access code of the data packet.

4. The method according to claim 1 where the trailing symbols refers to four trailing bits within a trailer of the access code of the data packet.

5. The method according to claim 1 where the defined sequence refers to a Baker sequence of bits in the data packet.

6. The method according to claim 3 further comprising:
   detecting a differential phase of the filtered signal; and
   estimating the timing of a received signal with respect to a reference signal to determine a phase adjustment of the a clock associated with the detection of the received signal, the received signal including one of the trailing symbols and the defined sequence as a received symbol pattern and the reference signal having a reference symbol pattern.

7. The method according to claim 6 where the estimating comprises determining a correlation between the received symbol pattern of the received signal and the reference symbol pattern of the reference signal to find a phase adjustment necessary to attain a peak correlation.

8. The method according to claim 1 where the manipulating comprises adding the compensatory direct current offset to the digital baseband signal to compensate for the unwanted direct current offset of the digital baseband signal, where the direct current offset has a magnitude opposite to that of the unwanted direct current offset.

9. The method according to claim 1 where the manipulating comprises subtracting the compensatory direct current offset to the digital baseband signal to compensate for the unwanted direct current offset of the digital baseband signal, where the direct current offset has a magnitude value of the same sign as that of the unwanted direct current offset.

10. A method for providing a timing estimation in a demodulator, comprising:
    inputting a digital signal indicative of differential phase of a received signal into a shift register;
    extracting selected bits of a data word in the shift register to form a received symbol pattern;
    providing an instantaneous correlation between the received symbol pattern and a reference symbol pattern;
    determining if the instantaneous correlation represents a substantial peak in the correlation to determine a corresponding timing factor to track the peak correlation on an on-going basis; and
    bypassing the determination of the peak in the correlation based upon the instantaneous correlation and a threshold.

11. The method according to claim 10 further comprising sending a phase adjustment, as the timing factor, to a clock generator for a receiver of the received signal.

12. The method according to claim 10 where the determining includes identifying the peak by analyzing instantaneous correlations associated with temporally offset registering of samples of the received symbol pattern to bits of the reference symbol pattern to determine an overall pattern of instantaneous correlations associated with corresponding temporal offsets.

13. The method according to claim 10 further comprising adding a compensatory direct current offset to each sample of the received symbol pattern to compensate for an unwanted frequency offset in the received signal.

14. The method according to claim 13 further comprising: converting the compensated sample from an absolute level to a logic level; and inputting the logic level into one input of an exclusive OR gate; and inputting a reference bit of a synchronization word into another input of the exclusive OR gate.

15. The method according to claim 14 further comprising summing an inverted output of a group of exclusive OR gates to derive an instantaneous correlation within a range of zero to a total number of the outputs taken from the shift register.

16. The method according to claim 14 further comprising establishing a minimum threshold as a sufficient instantaneous correlation so as to represent or approach a normalized correlation of one.

17. A method for providing a frequency estimation in a demodulator, comprising:
    inputting a digital signal indicative of differential phase of a received signal into a shift register;
    extracting selected bits of a data word in the shift register to form a received frequency evaluation word of the received signal;
    determining an unwanted direct current offset of the digital signal from an evaluation of one of trailing symbols and a defined sequence of an access code of a data packet of the received signal, wherein the unwanted direct current offset of the digital signal is determined without the evaluation of a preamble of an access code of the data packet, the unwanted direct current offset being caused by a frequency difference between the received signal and the transmitted signal; and
    generating a compensatory direct current offset to treat the digital signal to enhance demodulation.

18. The method according to claim 17 further comprising adding the generated compensatory direct current offset to the digital signal as treatment of the digital signal, where the compensatory direct current offset has an opposite magnitude to that of the unwanted direct current offset.

19. The method according to claim 17 further comprising subtracting the generated compensatory direct current offset to the digital signal as treatment of the digital signal, where the compensatory direct current offset has the same sign of magnitude as that of the unwanted direct current offset.

20. The method according to claim 17 further comprising comparing a first direct current offset of the received frequency evaluation word to a second direct current offset associated with a reference frequency evaluation word to estimate a difference between the first direct current offset and the second direct current offset, where the difference indicates the unwanted direct current offset.

21. The method according to claim 17 further comprising:
    determining a first average magnitude of the digital signal modulated with the received frequency evaluation word;
    referencing a second average magnitude of a reference digital baseboard signal modulated with a reference frequency evaluation word; and
    determining a difference between the first average magnitude and the second average magnitude to estimate an unwanted direct current offset of the baseboard digital signal.

22. The method according to claim 17 further comprising applying the compensatory direct current offset of approximately equal and opposite magnitude to the unwanted direct current offset to the digital signal to reduce or eliminate the unwanted direct current offset.

23. A system for controlling amplification in a receiver, the system comprising:
    an amplifier for amplifying a received signal in accordance with a controlled gain to enhance the reliability of demodulating the receive signal;
    a down-converter for deriving a lower frequency signal from down-converting the received signal;
    a digital-to-analog converter for converting the derived lower frequency signal into a digital baseband signal; and a frequency estimator for determining a compensatory direct current offset to the digital baseband signal to compensate for an unwanted direct current offset of the digital baseband signal, indicative of a frequency difference between the received signal and a transmitted signal, the frequency estimator determining the compensatory direct current offset by evaluation of one of trailing symbols and a defined sequence of an access code of a data packet of the received signal, wherein the frequency estimator determines the compensatory direct current offset without evaluating a preamble of the access code of the data packet.

24. The system according to claim 23 further comprising a filtering arrangement for filtering the digital baseband signal, the filtering arrangement comprising a first filter cascaded with a second filter to provide a low-pass response of magnitude versus frequency.

25. The system according to claim 24, further comprising a gain controller for receiving an intermediately filtered result from the first filter to generate a control signal for controlling the controlled gain during a preamble duration of the data packet.

26. The system according to claim 23 where the trailing symbols include four trailing bits within a trailer of the access code of the data packet.

27. The system according to claim 23 where the defined sequence includes a Baker sequence of bits in the data packet.

28. The system according to claim 23 further comprising:
a differential phase detector for detecting a differential phase of the filtered signal; and
a timing estimator estimating the timing of a received signal with respect to a reference signal to determine a phase adjustment of the a clock associated with the detection of the received signal.

29. The system according to claim 28 where the timing estimator includes a correlator for determining a correlation between a received symbol pattern of the received signal and a reference symbol pattern of a reference signal to find a phase adjustment necessary to attain a peak correlation, where one of the trailing symbols and the defined sequence substantially represents the received symbol pattern.

30. A system for providing a timing estimation in a demodulator, the system comprising:
a shift register for storing an input of a digital signal indicative of differential phase of a received signal;
a digital filter for receiving extracted, selected bits of a data word in the shift register to form a received symbol pattern, the digital filter providing an instantaneous correlation between the received symbol pattern and a reference symbol pattern;
an over-threshold trigger counter for determining if the instantaneous correlation exceeds a threshold; and
a peak detector for determining if the instantaneous correlation represents a general peak of a group of the instantaneous correlations to determine a corresponding timing factor associated with maintenance of the general peak on an on-going basis, wherein the over-threshold trigger counter bypasses the peak detector based upon the instantaneous correlation and the threshold.

31. The system according to claim 30 further comprising a clock generator for receiving a phase adjustment, as the timing factor, from the peak detector.

32. The system according to claim 30 further comprising:
a temporal sampling organizer for outputting the group of instantaneous correlations to the peak detector, where the instantaneous correlations are associated with a current sample of the instantaneous correlation, a past sample of the instantaneous correlation, and a prior sample older than the past sample.

33. The system according to claim 30 further comprising a peak-shaping assembly for emphasizing the instantaneous correlation or a set of instantaneous correlations as a peak of correlation versus time in preparation for application of the instantaneous correlation to the peak detector.

34. The system according to claim 30 where the peak detector identifies the general peak by analyzing instantaneous correlations associated with temporally offset registering of samples of the received symbol pattern with respect to bits of the reference symbol pattern to determine an overall pattern of instantaneous correlations associated with corresponding temporal offsets.

35. The system according to claim 30 further comprising a frequency estimator outputting a compensatory direct current offset to each sample of the received symbol pattern to compensate for unwanted frequency offset in the received signal.

36. The system according to claim 35 further comprising:
a signal level converter for converting the compensated sample into a logic level input; and
an exclusive OR gate accepting the logic level input and inputting the reference bit of a synchronization word into another input of the OR gate.

37. The system according to claim 30 further comprising:
an inverter coupled to the exclusive OR gate; and
a summer summing a group of inverter outputs to derive an instantaneous correlation within a range of zero to a total number of outputs taken from the shift register.

38. A system for providing a frequency estimation in a demodulator, comprising:
a shift register for storing a digital signal indicative of differential phase of a received signal;
a digital filter for receiving extracted, selected bits of a data word in the shift register to form a received frequency evaluation word in the received signal;
a frequency estimator for determining an unwanted direct current offset from an evaluation of one of trailing symbols and a defined sequence of an access code of a data packet of the received signal, the unwanted direct current offset being caused by a frequency difference between the received signal and the transmitted signal, wherein the frequency estimator determines the unwanted direct current offset without evaluating a preamble of the access code of the data packet; and
the frequency estimator adapted to generate a compensatory direct current offset to treat the bits of the data word in the register.

39. The system according to claim 38 where the compensatory direct current offset is added to the bits of the data word in the register to reduce or cancel out the unwanted direct current offset.

40. The system according to claim 38 where the compensatory direct current offset is subtracted to the bits of the data word in the register to reduce or cancel out the unwanted direct current offset.

41. The system according to claim 38 further comprising a data processor for comparing the direct current offset of the received frequency evaluation word to a direct current offset associated with a reference frequency evaluation word to determine the unwanted direct current offset.

42. The system according to claim 41 where the data processor determines a first average magnitude of a digital baseband signal modulated with the received frequency evaluation word, the data processing determining a second average magnitude of a reference digital baseband signal modulated with a reference frequency evaluation word; and the data processor taking a difference between the first average magnitude and the second average magnitude as an unwanted direct current offset of the baseband digital signal.

43. The system according to claim 38 where the frequency estimator is adapted to apply the compensatory direct current offset of approximately equal and opposite magnitude to the unwanted direct current offset to reduce or eliminate the unwanted direction current offset.

* * * * *

UNITED STATES PATENT AND TRADEMARK OFFICE
CERTIFICATE OF CORRECTION

PATENT NO. : 6,771,720 B1
DATED : August 3, 2004
INVENTOR(S) : Yang et al.

It is certified that error appears in the above-identified patent and that said Letters Patent is hereby corrected as shown below:

<u>Title page,</u>
Item [73], Assignee, change "Skyworks Solution, Inc." to -- Skyworks Solutions, Inc --.

Signed and Sealed this

Thirty-first Day of May, 2005

JON W. DUDAS
*Director of the United States Patent and Trademark Office*